United States Patent
Visser et al.

(10) Patent No.: US 9,654,609 B2
(45) Date of Patent: May 16, 2017

(54) OPTIMIZING AUDIO PROCESSING FUNCTIONS BY DYNAMICALLY COMPENSATING FOR VARIABLE DISTANCES BETWEEN SPEAKER(S) AND MICROPHONE(S) IN AN ACCESSORY DEVICE

(71) Applicant: QUALCOMM Incorporated, San Diego, CA (US)

(72) Inventors: Erik Visser, San Diego, CA (US); Michael Joseph Contour, San Diego, CA (US); Eric S. Mattis, San Diego, CA (US); Joseph Robert Fitzgerald, San Diego, CA (US); Kwokleung Chan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 920 days.

(21) Appl. No.: 13/664,639

(22) Filed: Oct. 31, 2012

(65) Prior Publication Data

US 2013/0156207 A1 Jun. 20, 2013

Related U.S. Application Data

(60) Provisional application No. 61/576,842, filed on Dec. 16, 2011, provisional application No. 61/616,876, filed on Mar. 28, 2012.

(51) Int. Cl.
*H03G 3/20* (2006.01)
*H04M 1/03* (2006.01)
(Continued)

(52) U.S. Cl.
CPC ......... *H04M 1/035* (2013.01); *H04M 1/0206* (2013.01); *H04M 1/20* (2013.01);
(Continued)

(58) Field of Classification Search
CPC ........ H04M 1/0206; H04M 1/035; H04R 3/02
See application file for complete search history.

(56) References Cited

U.S. PATENT DOCUMENTS 4,396,799 A * 8/1983 Franzen et al. .......... 379/388.02
5,631,899 A 5/1997 Duttweiler
(Continued)

FOREIGN PATENT DOCUMENTS

CN 1701528 A 11/2005
CN 101346896 A 1/2009
(Continued)

OTHER PUBLICATIONS

Breining, C., et al., "Acoustic Echo Control an Application of Very-High-Order Adaptive Filters," IEEE Signal Processing Magazine vol. 16, No. 4, pp. 42-69, XP055012609, ISSN: 1053-5888, DOI: 10.1109/79.774933.
(Continued)

*Primary Examiner* — Duc Nguyen
*Assistant Examiner* — Taunya McCarty
(74) *Attorney, Agent, or Firm* — Austin Rapp & Hardman

(57) ABSTRACT

An accessory device having multiple speakers and/or microphones to perform a number of audio functions, for use with mobile devices, are provided. The audio transducers (e.g., microphones and/or speakers) may be housed in one or more extendable and/or rotationally adjustable arms. To compensate for the unwanted signal feedback between the speakers and microphones, acoustic echo cancellation may be implemented to determine the proper distance and relative location between the speakers and microphones. Acoustic echo cancellation removes the echo from voice communications to improve the quality of the sound. The removal of the unwanted signals captured by the microphones may be accomplished by characterizing the audio signal paths from
(Continued)

the speakers to the microphones (speaker-to-microphone path distance profile), including the distance and relative location between the speakers and microphones. The optimal distance and relative location between the speakers and microphones is provided to the user to optimize performance.

44 Claims, 15 Drawing Sheets

(51) Int. Cl.
*H04M 1/02* (2006.01)
*H04M 1/20* (2006.01)
*H04M 9/08* (2006.01)
*H04R 3/02* (2006.01)

(52) U.S. Cl.
CPC .............. *H04M 9/082* (2013.01); *H04R 3/02* (2013.01); *H04R 2201/401* (2013.01); *H04R 2499/11* (2013.01)

(56) References Cited

U.S. PATENT DOCUMENTS

| | | | |
|---|---|---|---|
| 6,125,179 A | 9/2000 | Wu | |
| 6,744,882 B1 | 6/2004 | Gupta et al. | |
| 6,766,176 B1* | 7/2004 | Gupta et al. | 455/550.1 |
| 6,826,284 B1 | 11/2004 | Benesty et al. | |
| 7,006,624 B1 | 2/2006 | Philipsson et al. | |
| 7,672,446 B2 | 3/2010 | Thomas et al. | |
| 7,729,204 B2* | 6/2010 | Peng | G01S 15/74 367/127 |
| 7,840,012 B2 | 11/2010 | De Poortere | |
| 8,433,074 B2 | 4/2013 | Hoshuyama | |
| 8,630,426 B2 | 1/2014 | Svendsen | |
| 2003/0078073 A1 | 4/2003 | Lee | |
| 2003/0133565 A1 | 7/2003 | Chang et al. | |
| 2004/0052233 A1* | 3/2004 | Skog | H04M 1/7253 370/338 |
| 2004/0141418 A1 | 7/2004 | Matsuo et al. | |
| 2005/0153748 A1* | 7/2005 | Bodley | 455/569.1 |
| 2005/0213432 A1 | 9/2005 | Hoshuyama | |
| 2006/0093128 A1 | 5/2006 | Oxford | |
| 2006/0188104 A1 | 8/2006 | De Poortere et al. | |
| 2006/0245583 A1 | 11/2006 | Mizushima et al. | |
| 2007/0127737 A1 | 6/2007 | Lee | |
| 2008/0101622 A1 | 5/2008 | Sugiyama | |
| 2008/0246833 A1 | 10/2008 | Yasui et al. | |
| 2009/0047905 A1* | 2/2009 | Yang | 455/41.3 |
| 2009/0074177 A1 | 3/2009 | Takada | |
| 2009/0103743 A1 | 4/2009 | Honda | |
| 2009/0116658 A1* | 5/2009 | An | H04R 1/406 381/71.1 |
| 2009/0193743 A1 | 8/2009 | Wiercinski | |
| 2010/0048131 A1* | 2/2010 | Hirsch et al. | 455/41.3 |
| 2010/0072334 A1* | 3/2010 | Le Gette | F16M 11/041 248/176.3 |
| 2010/0079355 A1 | 4/2010 | Kilpatrick, II et al. | |
| 2010/0183163 A1 | 7/2010 | Matsui et al. | |
| 2010/0208907 A1 | 8/2010 | Ukai et al. | |
| 2010/0227643 A1 | 9/2010 | Yew et al. | |
| 2010/0267335 A1* | 10/2010 | Kohno | H04L 1/0014 455/41.2 |
| 2010/0272270 A1 | 10/2010 | Chaikin et al. | |
| 2011/0058667 A1 | 3/2011 | Takada | |
| 2011/0182439 A1* | 7/2011 | Sakurada | H04R 3/02 381/94.1 |
| 2011/0222701 A1 | 9/2011 | Donaldson et al. | |
| 2011/0282659 A1 | 11/2011 | Lim et al. | |
| 2013/0156209 A1 | 6/2013 | Visser et al. | |

FOREIGN PATENT DOCUMENTS

| | | |
|---|---|---|
| CN | 101803402 A | 8/2010 |
| CN | 102084315 A | 6/2011 |
| CN | 102165792 A | 8/2011 |
| JP | H07321729 A | 12/1995 |
| JP | 2003125069 A | 4/2003 |
| JP | 2003532351 A | 10/2003 |
| JP | 2007174190 A | 7/2007 |
| JP | 2010157806 A | 7/2010 |
| JP | 2010283483 A | 12/2010 |
| JP | 2011087218 A | 4/2011 |
| WO | 0059110 | 10/2000 |
| WO | 0184269 A2 | 11/2001 |
| WO | 2007049644 A1 | 5/2007 |
| WO | WO-2007086360 A1 | 8/2007 |

OTHER PUBLICATIONS

Constantinides G.A., et al., "Synthesis of Saturation Arithmetic Architectures", ACM Transactions on Design Automation of Electronic Systems, vol. 8, No. 3, Jul. 2003, pp. 334-354, Jul. 31, 2993 (2993-97-31), pp. 334-354, XP955959586.
Heitkamper, P. et al.: "Adaptive Gain Control for Speech Quality Improvement and Echo Suppression," Proceedings—IEEE International Symposium on Circuits and Systems 1, pp. 455-458, 1993.
Hirata S., et al., "Accuracy and resolution of ultrasonic distance measurement with high-time-resolution cross-correlation function obtained by single-bit signal processing", Acoustic. Science & Technology 30, Jun. 2009, Jun. 3, 2009 (Jun. 3, 2009), pp. 429-438, XP055060106, DOI: 10.1250/ast.30.429.
Humphrey, R.A., "Automatic Loudspeaker Location Detection for use in Ambisonic Systems", Internet Citation, Aug. 2006 (Aug. 2006), XP002469672, p. 1-p. 17, p. 65-p. 102, p. 119-p. 122, p. 137.
International Search Report and Written Opinion—PCT/US2012/063073—ISA/EPO—Apr. 29, 2013.
Jallet, J.P., "The Fully Networked Car", Mar. 7. 2008 (Mar. 7, 2008), pp. 1-13, XP055050239, Geneva, p. 5.
Loganathan P., et al., "A Sparseness Controlled Proportionate Algorithm for Acoustic Echo Cancellation", 16th European Signal Processing Conference (EUSIPCO 2008), Aug. 29, 2008 (Aug. 29, 2008), pp. 1-5, XP055051065, Lausanne, Switzerland.
Partial International Search Report—PCT/US2012/063073—ISA/EPO—Feb. 8, 2013.
Woolley S., et al., "Understanding Acoustic Echo Cancellation", NCSA Tech Tutorials, Jan. 1, 2007 (Jan. 1, 2007), pp. 1-4, XP055051070.
Anonymous: "Moor MR002 Premium Edition Stereo Bluetooth Headset", Dec. 11, 2010 (Dec. 11, 2010), XP055107188, Retrieved from the Internet: URL:http://www.mobilefun.co.uk/moor-mr002-premium-edition-stereobluetooth-headset-p27019.htm#description [retrieved on Mar. 12, 2014].

* cited by examiner

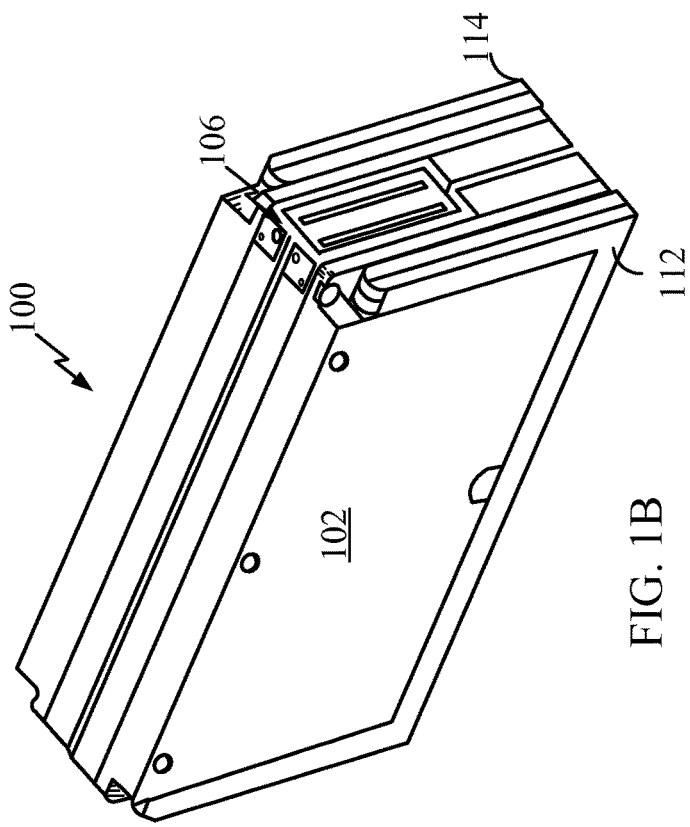
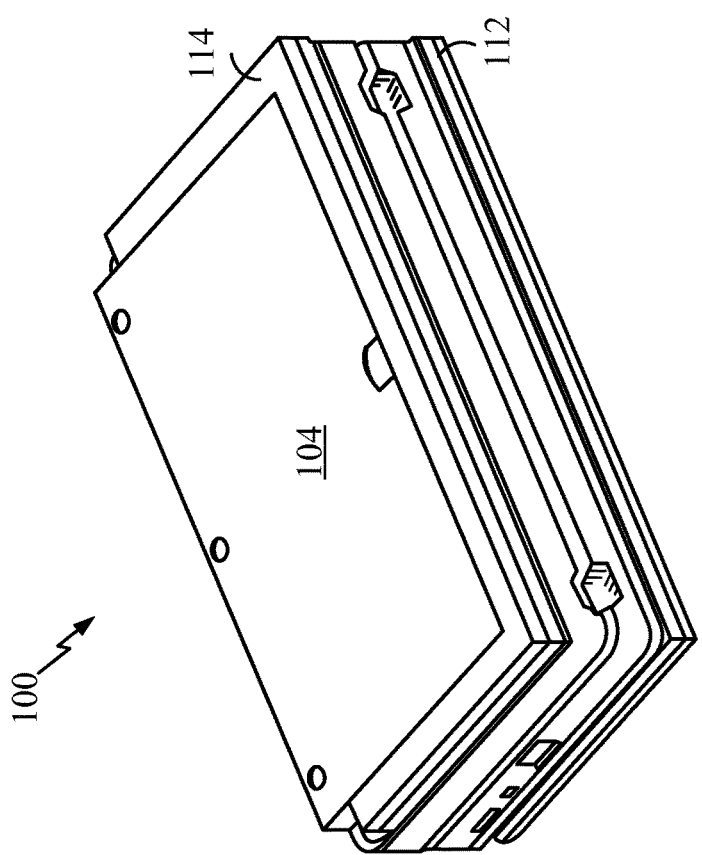
FIG. 1A
FIG. 1B

OPTIMIZING AUDIO PROCESSING FUNCTIONS BY DYNAMICALLY COMPENSATING FOR VARIABLE DISTANCES BETWEEN SPEAKER(S) AND MICROPHONE(S) IN AN ACCESSORY DEVICE

CLAIM OF PRIORITY UNDER 35 U.S.C. §119

The present Application for Patent claims priority to U.S. Provisional Application No. 61/576,842 entitled "Optimizing Audio Processing Functions by Dynamically Compensating for Variable Distances Between Speaker(s) and Microphone(s) in an Accessory Device and/or Mobile Device" filed Dec. 16, 2011, as well as U.S. Provisional Application No. 61/616,876 entitled "Optimizing Audio Processing Functions by Dynamically Compensating for Variable Distances Between Speaker(s) and Microphone(s) in an Accessory Device" filed Mar. 28, 2012, and assigned to the assignee hereof and hereby expressly incorporated by reference herein.

BACKGROUND

Field

Various features pertain to optimizing audio processing functions by dynamically compensating for variable distances and positions between one or more speakers and one or more microphones in an accessory device and/or a mobile device.

Background

Mobile devices are continuously evolving to add new features and/or enhance existing features. With the goal of improving audio quality, a plurality of different speakers may be used in a mobile device to enhance how a user receives audio. For instance, speakers may be distributed at various positions and/or locations of a mobile device. Likewise, to improve the capture of audio from the user, a plurality of microphones may be placed at various locations and/or positions of the mobile device. However, such arrangement of speakers and microphones tends to result in unwanted signal feedback from signals emanating from the plurality of speakers that are being captured by the plurality of microphones.

To compensate for the unwanted signal feedback, acoustic echo cancellation may be implemented. Acoustic echo cancellation can remove echo from voice communications to improve the quality of the sound, i.e. the echo cancellation algorithm can remove signals emanating from the speakers from desired user audio that are being captured by the microphones. The removing of the unwanted signals captured by the microphones requires characterizing the audio signal paths from the speakers to the microphones, including the distance and relative location between the speakers and microphones. However, such characterization is difficult to do when the microphones and/or speakers can be moved and/or its position/distance adjusted relative to each other.

Consequently, a method is needed that allows an accessory device and/or a mobile device to automatically and/or dynamically ascertain relative distances and positions between speakers and microphones.

SUMMARY

Various features facilitate the optimization of audio processing functions by dynamically compensating for variable distances and positions between one or more speakers and one or more microphones in an accessory device and/or a mobile device.

One feature provides accessory devices for optimizing audio processing functions.

According to a first aspect, an accessory device is provided comprising a housing, one or more extendable and/or rotationally adjustable arms secured to the housing, an audio module, and/or a communication interface. Each of the one or more extendable and/or rotationally adjustable arms may be independently adjustable. Each of the one or more adjustable arms may also be coupled to an audio transducer from a first plurality of audio transducers. The first plurality of audio transducers may include, for example, at least one of: microphones, speakers, or microphones and speakers. The audio module may be in communication with the first plurality of audio transducers and may be adapted to ascertain one or more distances between audio transducers in the first plurality of audio transducers and a second plurality of audio transducers to obtain a transducer-to-transducer path distance profile. The second plurality of audio transducers may include at least one of: internal speakers, external speakers, or internal and external speakers. In some implementations, at least some of the one or more other audio transducers from the second plurality of transducers are detachable from the accessory device.

The audio transducer from the first plurality of audio transducers may be variably adjustable relative to the second plurality of audio transducers by extension and/or rotation of the adjustable arms. A visual indicator may be located within the housing for indicating to a user to adjust a transducer-to-transducer spacing between the audio transducers in the first plurality and second plurality of audio transducers. A distance between each audio transducer in the first plurality of audio transducers and each audio transducer in the second plurality of audio transducers is estimated to obtain the transducer-to-transducer path distance profile. The communication interface may be coupled to the audio module and may be adapted to send the transducer-to-transducer path distance profile to a mobile device. For instance, the transducer-to-transducer path distance profile is transmitted to the mobile device wirelessly.

In one example the audio module may ascertain the one or more distances automatically by: (a) sending an audible or higher than audible frequency signal, and/or (b) measuring the shortest time delay between when the signal was sent and when it was received between a first audio transducer from the first plurality of audio transducers and a second audio transducer from the second plurality of audio transducers. According to one feature, the audio module may be further adapted to: (a) encode the audible or higher than audible frequency signal into an encoded signal that reduces the impact of noise sources during transmission, and/or (b) monitor for a code correlation between the encoded signal and received signals, by audio transducers from the first plurality of audio transducers and the second plurality of audio transducers, to ascertain a match.

In one embodiment, predefined detents in the one or more extendable and/or rotationally adjustable arms may be used to determine the distance between two audio transducers. In another embodiment, one or more sensors located on the one or more extendable and/or rotationally adjustable arms may be used to detect a position of the one or more extendable and/or rotationally adjustable arms. According to one embodiment of the housing, a slot may extend horizontally along a top surface of the housing. A first end of a first section of the plurality of sections of the one or more extendable and/or rotationally adjustable arms is slideably engaged with the slot allowing the one or more extendable and/or rotationally adjustable arms to move horizontally across the housing.

The accessory device may also include a speaker driving circuit to send higher than audible frequency sound, through at least one audio transducer from the first plurality of audio transducers and the second plurality of audio transducers, at a higher volume than the audible sound to raise the higher than audible frequency sound above an ambient noise floor.

A digital gain and an analog gain of sound propagation paths for at least some of the audio transducers from the first plurality of audio transducers and second plurality of audio transducers may be dynamically adjusted by the mobile device. The digital gain and analog gain of sound propagation paths for at least some of the audio transducers from the first plurality of audio transducers and second plurality of audio transducers are adjusted to ensure audio output from speaker audio transducers does not saturate input into microphone audio transducers.

The audio module may further ascertain the one or more distances by refining the one or more distances by using temperature and humidity information to select a speed of sound propagation from a lookup table. In one example, the audio module may further ascertain a volume for audio transducers in at least one of the first plurality of audio transducers or the second plurality of audio transducers and sends the volume to the mobile device to determine a signal to noise ratio. In another example, the audio module may further adjust a maximum volume limit of one or more speaker audio transducers, from at least one of the first plurality or second plurality of audio transducers, based on a distance from the one or more speaker audio transducers to one or more microphone audio transducers. In yet another example, the audio module may further ascertain a distance between one or more microphone audio transducers, from at least one of the first plurality or second plurality of audio transducers, and one or more speaker audio transducers as a user interface to control other functions of the accessory device or mobile device.

According to a second aspect, a method operational on an accessory device is provided for optimizing audio processing functions. One or more distances are ascertained between audio transducers in the first plurality of audio transducers, coupled to extendable and/or rotationally adjustable arms of the accessory device, and a second plurality of audio transducers to obtain a transducer-to-transducer path distance profile. The one or more distances may be automatically ascertained by sending an audible or higher than audible frequency signal and measuring the shortest time delay between when the signal was sent and when it was received between a first audio transducer from the first plurality of audio transducers and a second audio transducer from the second plurality of audio transducers. The transducer-to-transducer path distance profile is then sent to a mobile device. According to one feature, the audible or higher than audible frequency signal is encoded into an encoded signal that reduces the impact of noise sources during transmission. The received signals, sent by audio transducers from the first plurality of audio transducers and the second plurality of audio transducers, may be correlated with the encoded signal to ascertain a match.

According to one example, the one or more distances may be ascertained by refining the one or more distances by using temperature and humidity information to select a speed of sound propagation from a lookup table. In another example, ascertaining the one or more distances may include sending higher than audible frequency sound, through at least one audio transducer from the first plurality of audio transducers and the second plurality of audio transducers, at a higher volume than the audible sound to raise the higher than audible frequency sound above an ambient noise floor.

In one example, a distance between two audio transducers, from the first plurality and second plurality of audio transducers, may be determined based on the position of predefined detents in one or more extendable and/or rotationally adjustable arms that are part of the accessory device and to which the first plurality of audio transducers are coupled. In another example, at least some of the one or more distances may be determined based on the position indicated by one or more sensors located in one or more extendable and/or rotationally adjustable arms that are part of the accessory device and to which the first plurality of audio transducers are coupled.

The accessory device may receive adjustments, from the mobile device, to the transducer-to-transducer path distance profile to optimize performance of the mobile device. The accessory device may then provide a visual feedback to a user to manually adjust a transducer-to-transducer spacing between the audio transducers in the first plurality and second plurality of audio transducers.

According to one aspect, a volume may be ascertained for at least some of the audio transducers in the first plurality or second plurality of audio transducers. The volume is then sent to the mobile device to determine a signal to noise ratio.

According to another aspect, a maximum volume limit of one or more speaker audio transducers, from at least one of the first plurality or second plurality of audio transducers, may be adjusted based on a distance from the speaker audio transducers to one or more microphone audio transducers.

A distance between one or more microphone audio transducers, from at least one of the first plurality or second plurality of audio transducers, and one or more speaker audio transducers may be ascertained and used as a user interface to control other functions of the accessory device or mobile device.

BRIEF DESCRIPTION OF THE DRAWINGS

Various features, nature, and advantages may become apparent from the detailed description set forth below when taken in conjunction with the drawings in which like reference characters identify correspondingly throughout.

FIG. 1 (comprising FIGS. 1A and 1B) illustrates perspective views of an exemplary accessory device in a closed configuration, according to one example.

DETAILED DESCRIPTION

Figure 2:
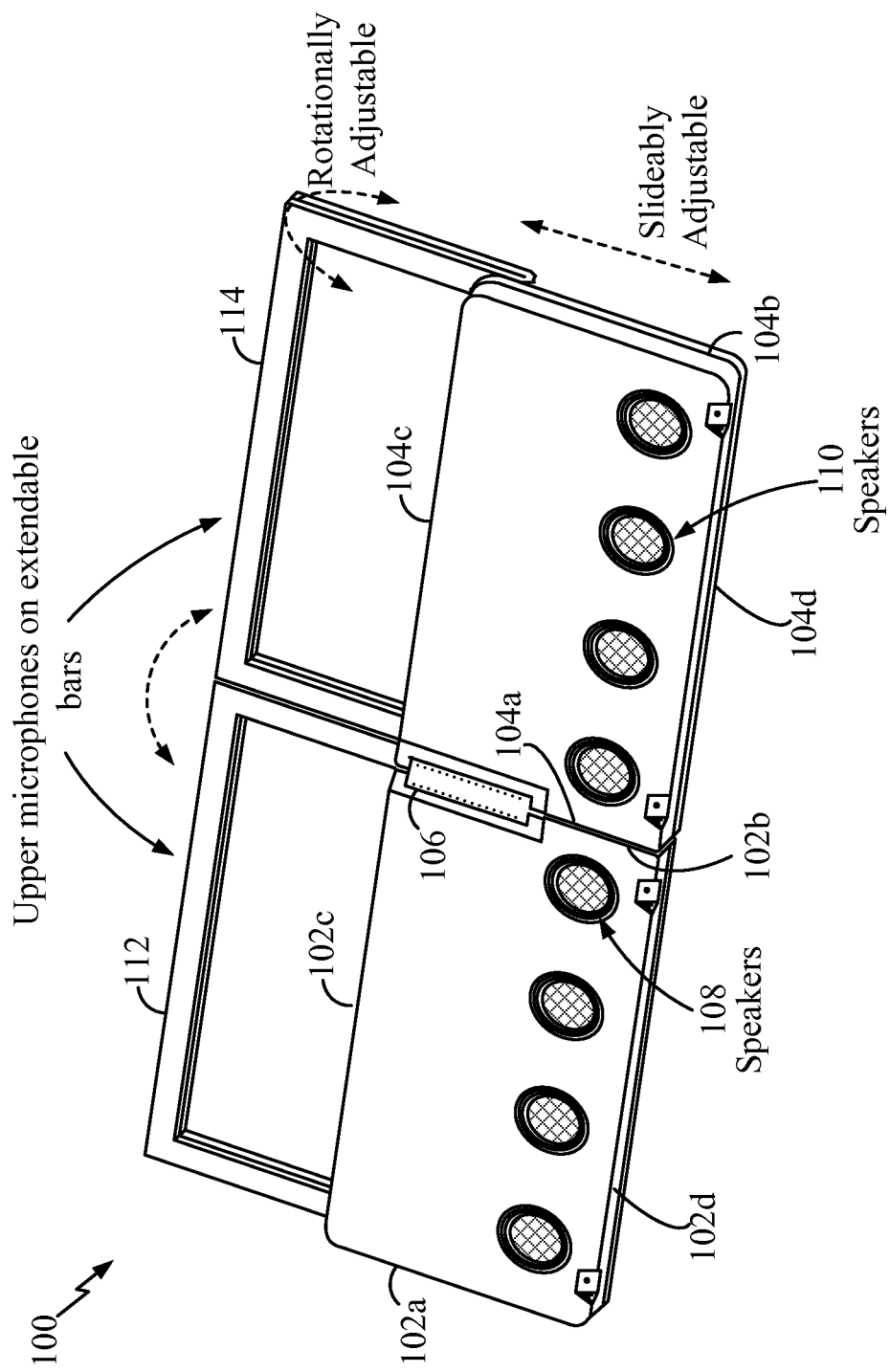
FIG. 2 illustrates the accessory device of FIG. 1 in an open configuration.

In the following description, specific details are given to provide a thorough understanding of the embodiments. However, it will be understood by one of ordinary skill in the art that the embodiments may be practiced without these specific detail. For example, circuits may be shown in block diagrams in order avoid obscuring the embodiments in unnecessary detail. In other instances, well-known circuits, structures and techniques may not be shown in detail in order not to obscure the embodiments.

The word "exemplary" is used herein to mean "serving as an example, instance, or illustration." Any implementation or embodiment described herein as "exemplary" is not necessarily to be construed as preferred or advantageous over other embodiments. Likewise, the term "embodiments" does not require that all embodiments include the discussed feature, advantage or mode of operation.

The term "mobile device" may refer to a wireless device, a mobile phone, a mobile communication device, a user communication device, personal digital assistant, mobile palm-held computer, a laptop computer, and/or other types of mobile devices typically carried by individuals and/or having some form of communication capabilities (e.g., wireless, infrared, short-range radio, etc.). The term "accessory device" may refer to any device capable of communicating with a mobile device either wired or wirelessly and having one or more speakers and/or one or more microphones for broadcasting or capturing acoustic signals on behalf of the mobile device. The term "audio transducer" may refer to any device capable of capturing audio (e.g., microphones) and/or transmitting audio (e.g., speakers).

The term "closed configuration" or "stowed configuration" may refer to a mobile device and/or accessory device in which speakers and/or microphones are placed or arranged in a compact way for storage or transport of the mobile device and/or accessory device. The term "open configuration" or "deployed configuration" may refer to a mobile device and/or accessory device in which speakers and/or microphones are slideably or rotatable moved from a stowed position.

Overview

Accessory devices, having multiple loudspeakers (or "speakers") and microphones to perform a number of audio functions, for use with mobile devices, are provided. Since consumers (or "users") desire to carry or transport the accessory devices along with the mobile device, accessory devices may be designed small in order to enhance their transportability while at the same time allowing for them to be deployed in a larger configuration to perform its intended functions. To accommodate transportability, accessory devices may be operable between a closed or stowed configuration for transport or storage and one or more open or deployed configurations to perform their intended functions. As such, the speakers and microphones may be variably adjustable relative to each other. However, this variability can lead to unwanted signal feedback between the speakers and microphones.

To compensate for the unwanted signal feedback between the speakers and microphones, the mobile device may implement acoustic echo cancellation which removes echo from voice communications to improve the quality of the sound. The removing of the unwanted signals captured by the microphones may be accomplished by characterizing the audio signal paths from the speakers to the microphones, including the distance and relative location between the speakers and microphones and then using this characterization or path distance profile to adjust the echo canceller (algorithm) in the mobile device. To adjust the echo canceller, the mobile device may estimate a distance between each speaker and each microphone and then use this information to estimate a signal-to-noise ratio (SNR) as a ratio of a near-end user speech signal to an echo signal. The estimated SNR may then be used to adjust parameters and thresholds for tuning echo canceller performance such as learning rates, far end reference scaling, double talk detector thresholds, etc. Furthermore, if the SNR is below a threshold value, the speaker volume may be reduced or limited for better double talk performance and to avoid non-linear coupling between the microphones and speakers. Alternatively, if a louder volume is desired, visual feedback may be provided to the user instructing the user to physically adjust the microphone to speaker distance.

Accessory Device in a Closed Configuration

FIG. 1 (comprising FIGS. 1A and 1B) illustrates perspective views of an exemplary accessory device 100 in a closed or stowed configuration for transport or storage by a user. The accessory device 100 may comprise a pair of housings 102, 104 (See FIG. 2) that may be folded together about a hinge assembly 106 to form the closed configuration. Each of the housings 102, 104 may have a pair of side edges 102a, 104a and 102b, 104b, a top edge 102c, 110c and bottom edge 102d, 104d (See FIG. 2). The housings 102, 104 may be joined together by the hinge assembly 106 secured to the side edges 102b, 104a. A plurality of speakers 108, 110, and one or more extendable bars 112, 114 may be attached to the respective housings 102, 104.

The one or more extendable bars 112, 114 may be slideably attached to a back surface of the housings 102, 104 or may be slideably attached to the side edges 102*a*, 104*a* and 102*b*, 104*b*. Each of the extendable bars 112, 114 may include one or more microphones and may be slideably and/or rotationally adjustable relative to the housings 102, 104 for adjusting the spacing between the microphones and the speakers. As described in more detail below, the extendable bars 112, 114 may also include sensors, such as angular rotation sensors and the like, and/or detents for determining the distance between the microphones and the speakers. Additionally, the speakers may be fixedly attached to the housings or may be adjustable with respect to the housings.

When in the closed configuration, the accessory device 100 may easily fit within a pocket, briefcase or the like of the user for storage or transport. The accessory device 100 may communicate wired or wirelessly with a mobile device.

Exemplary Accessory Device in an Open Configuration

FIG. 2 illustrates the exemplary accessory device 100 of FIG. 1 in an open configuration. The open configuration of the accessory device 100 may allow the accessory device 100 to perform all of its intended functions. For example, to improve audio quality, a plurality of different speakers may be used in the accessory device to enhance how the user receives audio. As shown, each housing 102, 104 of the accessory device 100 may include one or more speakers 108 and 110 (fixedly or adjustably attached to the housing), respectively and one or more microphones located on each of the extendable bars 112 and 114 located at various positions and/or locations.

As described above, the accessory device 100 may be foldable and, in this example, the microphones may be rotationally adjustable and/or slideably adjustable as part of one or more extendable bars 112 and 114. Consequently, the distance and/or position of the microphones relative to the speakers 108 and 110 may change depending on how the user positions and/or adjusts the extendable bar(s).

Each housing 102, 104 may be operable to move or rotate about the hinge assembly 106 such that the distance between the outer edges 102*a*, 104*b* of the housings varies. In one example, when the accessory device 100 is in the closed configuration, the first housing 102 may be rotated in the range of 0° to 180° counterclockwise about the hinge assembly 106. When in a completely open configuration, the first housing 102 may rotate clockwise in the range of 0° to 180°. Alternatively, the second housing 104 may rotate counterclockwise or clockwise relative to the first housing 102. In yet another embodiment, each of the housings may be able to rotate up to 360° relative to the other housing.

As shown, the extendable bars 112, 114 may be slideably and rotatably adjustable relative to the housings 102, 104 allowing the user to adjust the microphones and speakers to obtain the desired audio quality. As such, the distance between the microphones and the speakers may be dynamically adjusted by the user.

Figure 3:
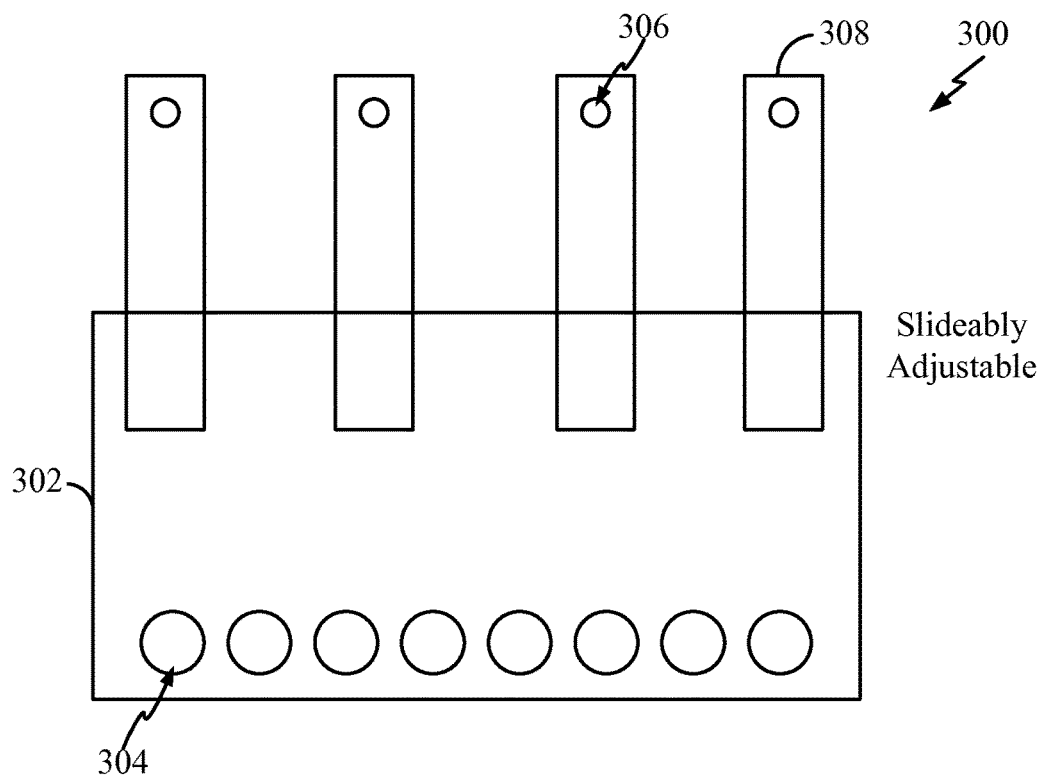
FIG. 3 illustrates an accessory device, in an open configuration, having a plurality of speakers and slideably adjustable microphones, according to one example.
Figure 4:
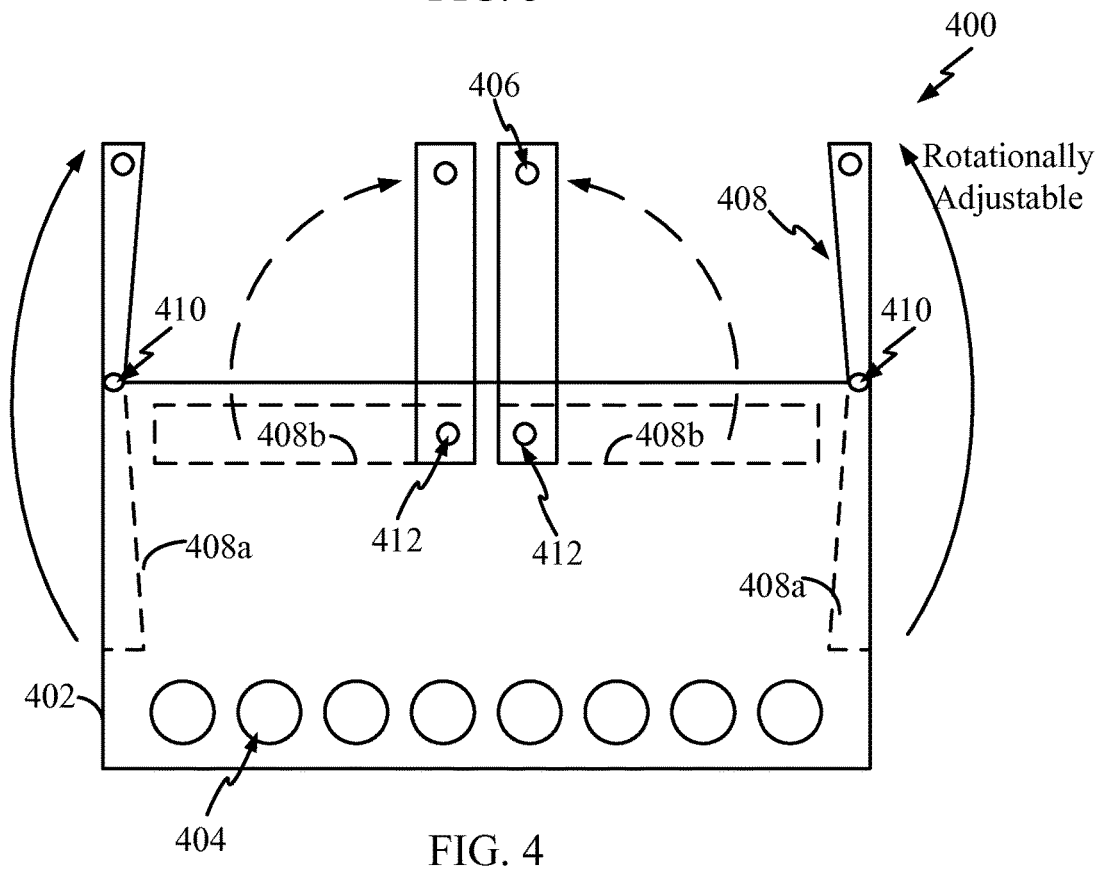
FIG. 4 illustrates an accessory device, in an open configuration, having a plurality of speakers and rotatably adjustable microphones, according to one example.
Figure 5:
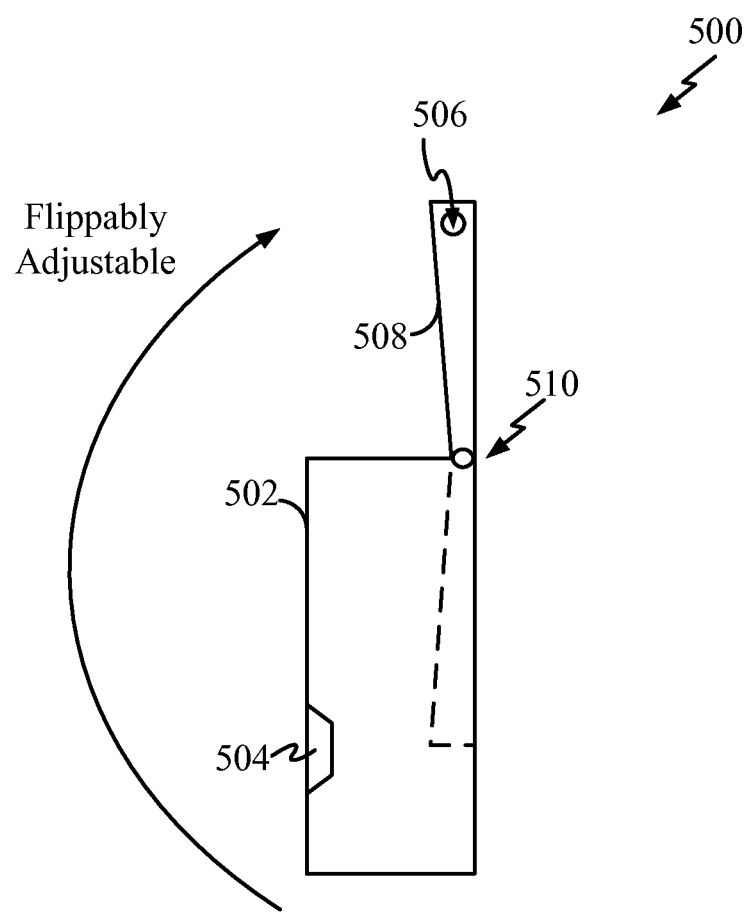
FIG. 5 illustrates an accessory device, in an open configuration, having at least one speaker and at least one flippably adjustable microphone, according to one example.

As illustrated in FIGS. 3-5, other accessory device configurations are possible where one or more microphones and/or speakers may have their relative position and/or distance dynamically adjusted by the user during operation of the accessory device. In some instances, the speakers and/or microphones may be wired and/or wirelessly coupled to the body of a mobile device.

FIG. 3 illustrates an accessory device, in an open configuration, having a plurality of speakers and slideably adjustable microphones, according to one example. As shown, the accessory device 300 may include a housing 302 having a plurality of speakers 304 located at fixed locations and a plurality of microphones 306 that may be slideably adjustable as part of one or more extendable bars 308. For example, the microphones 306 may be fixedly located on the extendable bars 308 which may be adjustable by slideably extending upwardly from the housing 302. Consequently, the distance and/or position of the microphones 306 relative to the speakers 304 may change depending on how the user slideably adjusts the extendable bar(s) 308. Although four (4) extendable bars 308 are shown, this is by way of example only and more or less extendable bars may attached to the housing 302. Each of the extendable bars 308 may be slideably adjusted upwards or downwards separately or collectively. Alternatively, the positions of the speakers may adjustable by the user.

FIG. 4 illustrates an accessory device, in an open configuration, having a plurality of speakers and rotatably adjustable microphones, according to one example. As shown, the accessory device 400 may include a housing 402 having plurality of speakers 404 located at fixed locations and a plurality of microphones 406 that may be rotatably adjustable as part of one or more extendable bars 408. When in an open configuration, the extendable bars 408 may be rotated via a rotatable hinge assembly 410. As shown, when in the closed or stowed configuration, a first pair of extendable bars 408*a* may be parallel to the side surface of the housing 402 and a second pair of extendable bars 408*b* may be parallel to the top and bottom surfaces of the housing 402. In this example, the first pair extendable bars 408*a* may be rotated in the range of 0° to 180° counterclockwise or clockwise via the rotatable hinge assembly 410 and the second pair of extendable bars 408*b* may be rotated in the range of 0° to 90° counterclockwise or clockwise via a second rotatable hinge assembly 412. Alternatively, the positions of the speakers may adjustable by the user. In one embodiment, when in the closed or stowed configuration, the first pair of extendable bars 408*a* may be perpendicular to the second pair of extendable bars 480*b*.

FIG. 5 illustrates an accessory device, in an open configuration, having at least one speaker and at least one flippably adjustable microphone, according to one example. As shown, the accessory device 500 may include a housing 502 having at least one speaker 504 located at a fixed location and at least one microphone 506 that may be rotatably adjustable as part of one or more extendable bars 508. For example, the microphone 506 may be fixedly attached to the end of an extendable bar 508 which is rotatably attached to the housing via a rotatable hinge assembly 510. When in a closed configuration, the extendable bar 508 may rest against or be embedded within the housing 502. In this example, when the accessory device is in a closed configuration, to adjust the microphone 506 the extendable bar may be rotated in the range of 0° to 270° clockwise via the rotatable hinge assembly 510. As described in more detail below, the extendable bars may also include sensors, such as angular rotation sensors and the like, and/or detents for determining the distance between the microphones and the speakers. Additionally, the speakers 504 may be fixedly attached to the housing 502 or may be adjustable.

Exemplary Microphones/Extendable Bars Configurations

Figure 6A:
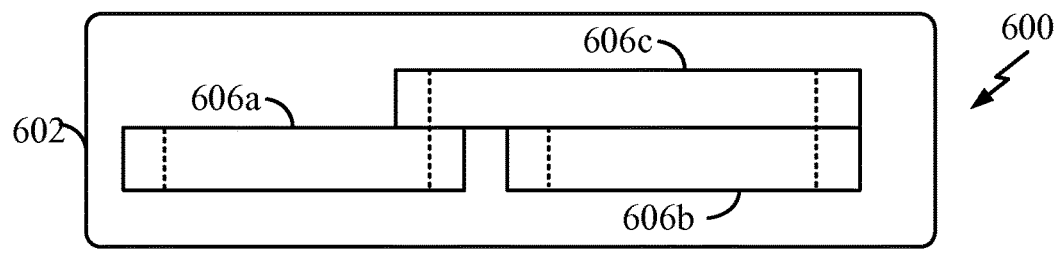
FIG. 6A illustrates a top view of an accessory device with an extendable bar in a closed or stowed configuration, according to one example.
Figure 6B:
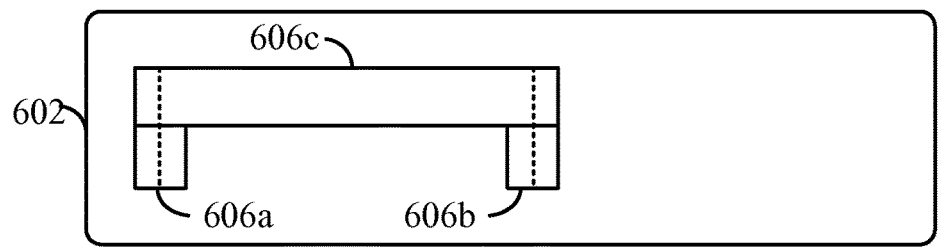
FIG. 6B illustrates a top view of the accessory device with the extendable bar of FIG. 6B in an open or deployed configuration.
Figure 6C:
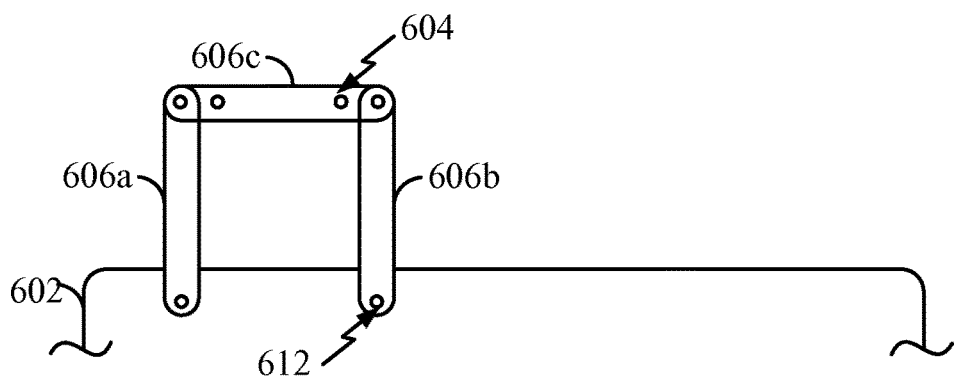
FIG. 6C illustrates a front view of the extendable bar of FIG. 6B.
Figure 6D:
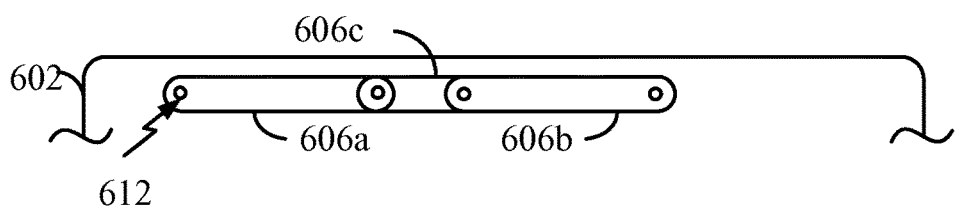
FIG. 6D illustrates a front view the extendable bar of FIG. 6B.

FIG. 6A illustrates a top view of an accessory device with an extendable bar in a closed or stowed configuration, according to one example. FIG. 6B illustrates a top view of the accessory device with the extendable bar of FIG. 6B in an open or deployed configuration. FIG. 6C illustrates a front view of the extendable bar of FIG. 6B. FIG. 6D illustrates a front view the extendable bar of FIG. 6B.

As discussed above, an accessory device 600 may include a housing 602 having one or more microphones 604, fixedly attached to one or more extendable bars 606, and one or more speakers (not shown). As illustrated in FIG. 6A, the accessory device 600 may include an extendable bar 606 having three (3) moveable/adjustable sections 606a-606c rotatably secured together. Both the first and second sections 606a, 606b of the extendable bar 606 may have a first end rotatably hinged to the housing 602 and a second end rotatably hinged to respective ends of the third section 606c of the extendable bar 606. In this example, when in the closed or stowed configuration, the first and second sections 606a, 606b of the extendable bar 606 may be parallel to the third section of the extendable bar 606c and the third section 606c of the extendable bar 606 may be located within a different vertical plane than the first and second sections 606a, 606b extendable bar 606.

The extendable bar 606 may be adjusted or re-positioned by rotating upwards via rotatable hinges 612. As illustrated in FIG. 6C, first and second sections 606a, 606b of the extendable bar 606 may be rotated upwardly. The first and second sections 606a, 606b of the extendable bar 606 may be rotated in the range of 0° to 180° (clockwise or counter-clockwise) from the closed or stowed configuration. When not in use and when being transported, the first and second sections 606a, 606b of the extendable bar 606 may be rotated downwardly to the closed or stowed configuration. The first and second sections 606a, 606b of the extendable bar 606 may be moved separately or collectively. Furthermore, the sections of the extendable bar 606 may also include sensors, such as angular rotation sensors and the like, and/or detents for determining the distance between the microphones and the speakers.

Figure 7A:
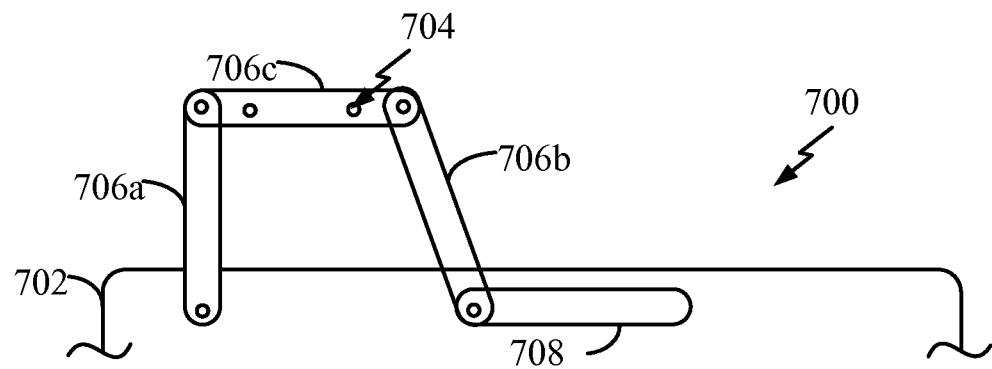
FIG. 7A illustrates a front view of an accessory device with an extendable bar in an open or deployed configuration, according to one example.
Figure 7B:
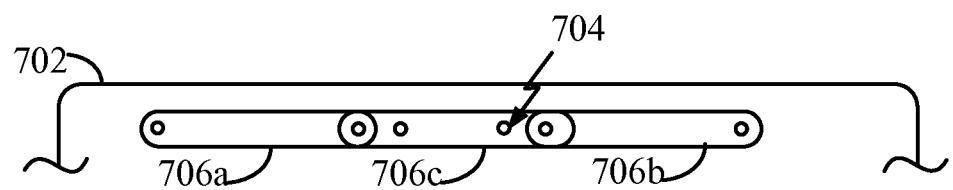
FIG. 7B illustrates a top view of the accessory device with the extendable bar of FIG. 7A in a closed or stowed configuration.
Figure 7C:
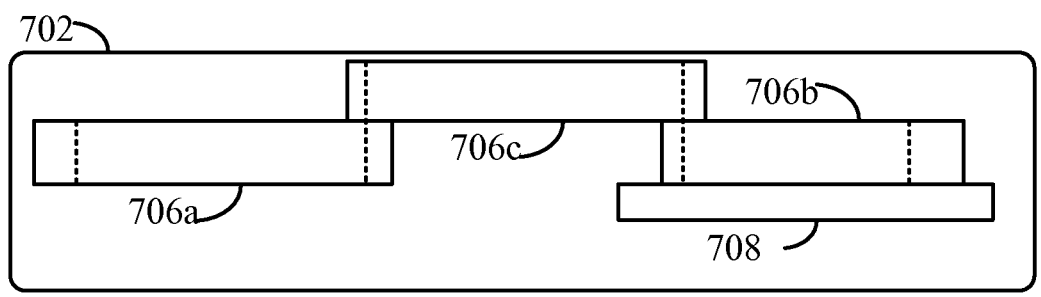
FIG. 7C illustrates a top view of the accessory device with the extendable bar of FIG. 7A in an open or deployed configuration.

FIG. 7A illustrates a front view of an accessory device with an extendable bar in an open or deployed configuration, according to one example. FIG. 7B illustrates a top view of the accessory device with the extendable bar of FIG. 7A in a closed or stowed configuration. FIG. 7C illustrates a top view of the accessory device with the extendable bar of FIG. 7A in an open or deployed configuration.

As discussed above, an accessory device 700 may include a housing 702 having one or more microphones 704 fixedly attached to one or more extendable bars 706 and one or more speakers (not shown). As illustrated in FIG. 7A, the accessory device 700 may include an extendable bar 706 having three (3) moveable/adjustable sections 706a-706c rotatably secured together. The first section 706a of the extendable bar 706 may have a first end rotatably hinged to the housing 702 and the second section 706b of the accessory device 700 may have a first end slideably received within a slot 708, extending horizontally along a top edge of a side of the housing, allowing the second section 706b of the extendable bar 706 to slide horizontally across the accessory device 700. The second end of the first section 706a of the extendable bar 706 may be rotatably hinged to a first end of the third section 706c of the extendable bar 706 and the second end of the second section 706b of the extendable bar 706 may be rotatably hinged to the second end of the third section 706c of the extendable bar 706.

The first and second sections 706a, 706b of the extendable bar 706 may be rotated in the range of 0° to 360° (clockwise or counterclockwise) from the closed or stowed configuration. When not in use and when being transported, the first and second sections 706a, 706b of the extendable bar 706 may be rotated downwardly to the closed or stowed configuration.

Ascertaining Paths of Sound Propagation

Figure 8:
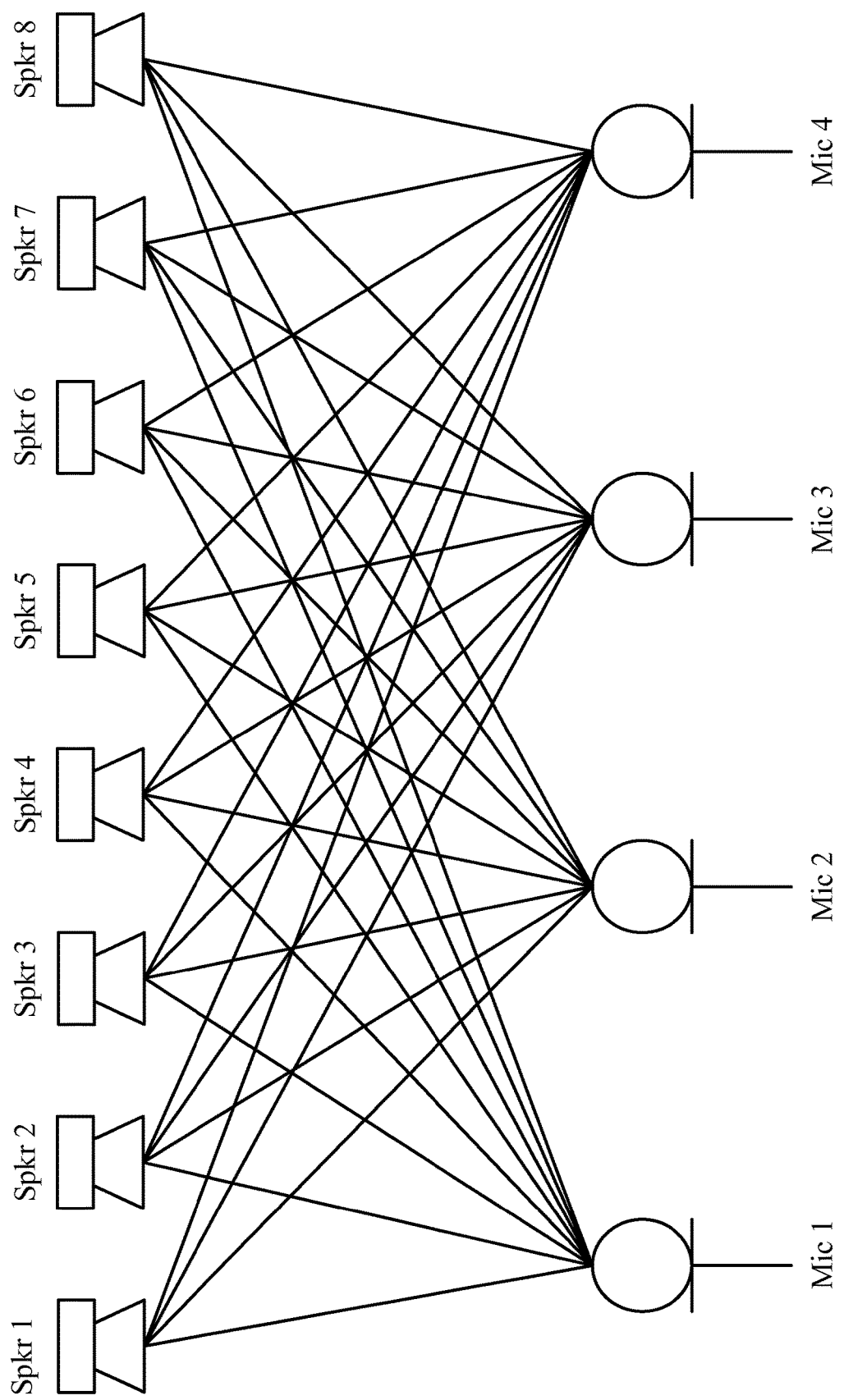
FIG. 8 illustrates direct paths of sound propagation in an accessory device having eight (8) speakers and four (4) microphones.

An accessory device having multiple speakers and multiple microphones may have a plurality of sound propagation paths in which the sound received by one or more microphones travels to one or more speakers. FIG. 8 illustrates direct paths of sound propagation in an accessory device having eight (8) speakers and four (4) microphones. A mobile device may utilize an acoustic echo canceller and volume control functions to dynamically compensate for variable distances between one or more speakers and/or one or more microphones in an accessory device and/or the mobile device to optimize performance of the mobile device. In order to implement such dynamic functions, the processing circuit that implements such functions in the mobile device has to know the distances from each speaker to each microphone in the accessory device so that the acoustic echo cancelling and/or volume control algorithms can be fine-tuned based on the actual device configuration employed by the user. As shown, an accessory device having eight (8) speakers and four (4) microphones may result in 32 direct paths of sound propagation.

There are various methods known in the art that are available to measure the distance between the speakers and the microphones. According to one implementation, mechanical methods may be used to ascertain the distance between speakers and microphones. For instance, predefined detents located in the extendable bars where the microphones are located may be used to ascertain distances (e.g., by having sensors or other electrical methods that detect the selected extendable bar position and translate that to a physical distance). Similarly, predefined detents may be used where the extendable bars are rotationally adjustable.

According to another approach, angular rotation sensors for the extendable bars may serve to electrically determine the current angular setting of the extendable bars and translate that to a physical distance. That is, sensors located on extendable bars may detect to what angle the extendable bars have been rotated. This information may then be sent to the acoustic echo canceller (algorithm) on the mobile device. Using this information, the echo canceller can provide a visual feedback to the user to physically adjust the microphone to speaker distance. The visual feedback may be provided on the display of the mobile device and/or the accessory device, if available.

In yet another approach, acoustic methods, which are well known in the art, may be used to obtain audio ranging measurements to determine the physical path from each speaker to each microphone. The audio ranging measurements may be sent to the acoustic echo canceller (algorithm) on the mobile device. Using this information, the echo canceller can provide a visual feedback to the user to physically adjust the microphone to speaker distance. The visual feedback may be provided on the display of the mobile device and/or the accessory device, if available.

Exemplary Accessory Device and Operations Therein

Figure 9:
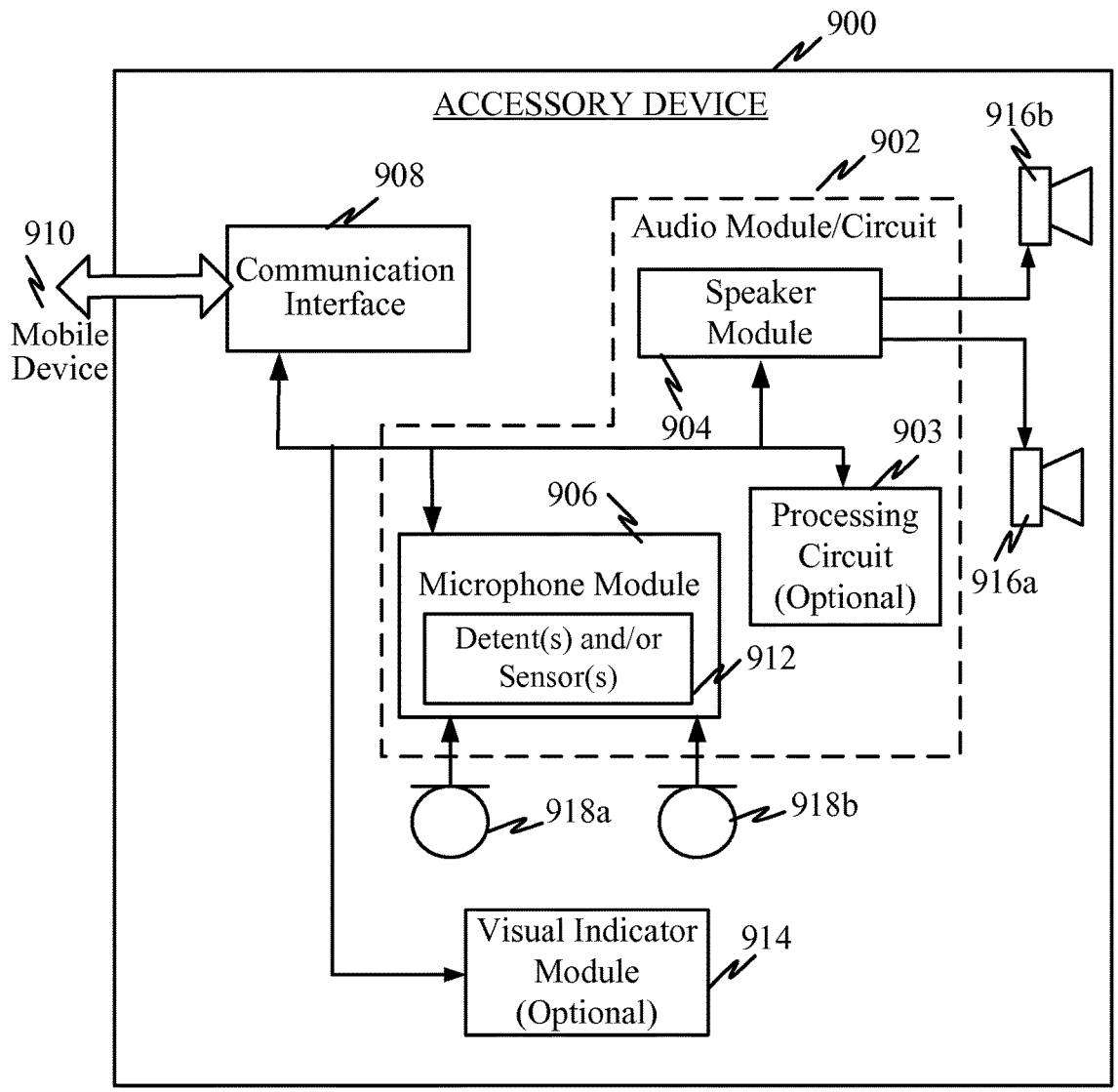
FIG. 9 illustrates a block diagram of an internal structure of an accessory device according to one example.

FIG. 9 illustrates a block diagram of an internal structure of an accessory device according to one example. The accessory device 900 may include an audio module/circuit 902 having a speaker module 904 for producing sound in response to an electrical audio signal input and a microphone module 906 for converting sound into an electrical signal. The audio module/circuit 902 may optionally include a processing circuit (e.g., processor, processing module, etc.) 903 for executing computer-executable process steps. The accessory device 900 may include one or more audio transducers (e.g., microphones and/or speakers), where the transducer-to-transducer spacing is manually adjustable. The accessory device is configured/adapted to obtain a transducer-to-transducer path distance profile and provide it to a mobile device which can then act to perform echo cancellation and/or volume adjustments by instructing a user of the accessory device to adjust distances between the one or more transducers.

The speaker module 904 may include, or be coupled to, one or more speakers 916a and 916b and the microphone module 906 may include, or be coupled to, one or more extendable and/or rotationally adjustable bars/arms housing one or more microphones 918a and 918b. The speakers 916 and/or microphones 918 may be generically referred to as audio transducers. In one embodiment, within the microphone module 906, the one or more adjustable bars may also house detents and/or sensors 912 for determining the distance between the speakers and the microphones. The accessory device 900 may also include a communication interface 908 for communicatively coupling (wired or wirelessly) the accessory device 900 to a mobile device 910. Optionally, the accessory device 900 may include a visual indicator module 914 for providing visual feedback to a user to manually adjust microphone-to-speaker spacing of the one or more speakers and the one or more microphones housed on the accessory device to adjust the speaker-to-microphone path distance profile. The visual indicator module may be a display or one or more lights, such as light emitting diodes (LED). The display may provide a written message to the user to adjust the speaker-to-microphone path distance profile while the LEDs may be used to provide a visual indication in the form of lights or pattern of lights to the user to adjust the speaker-to-microphone path distance profile.

Figure 10:
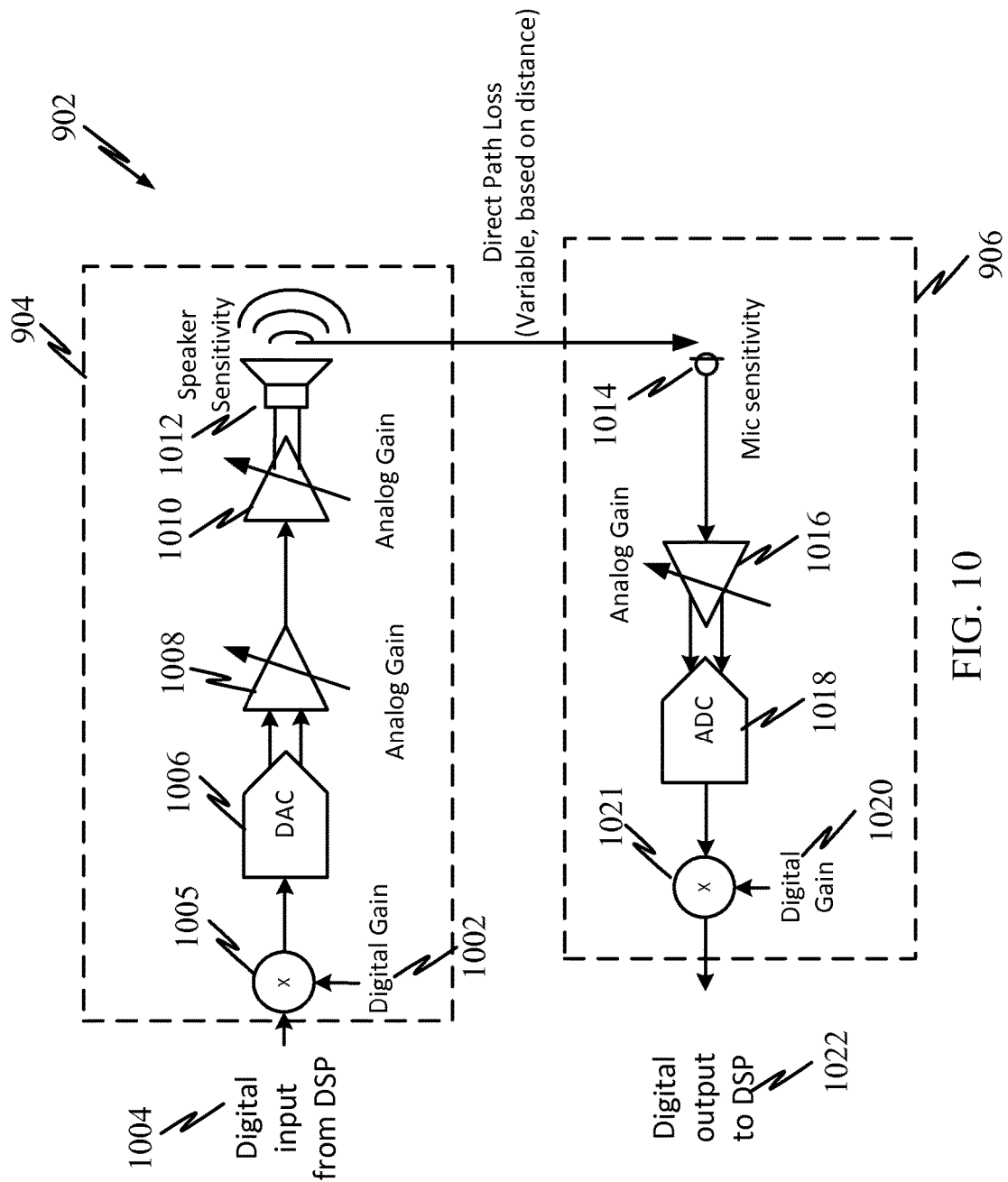
FIG. 10 illustrates an example of the internal structure of the audio module of FIG. 9.

FIG. 10 illustrates an example of the internal structure of the audio module 902 of FIG. 9. The audio module 902 may be used to implement a loudness control algorithm. The loudness control algorithm may be used to automatically reduce or increase sound to a pre-defined level or threshold.

The Digital Gain (1002, 1020), Analog Gain (1008, 1016) for both speaker and microphone paths may be controlled by software and dynamically adjusted by the processing circuit of the mobile device. The loudness control algorithm makes use of the direct path loss, which is a function of microphone to speaker distance, and adjusts the digital and/or analog gains in the speaker path to ensure that the audio output does not saturate the microphone input.

In the speaker module 904, located in the audio module 902, a digital gain 1002 and a digital input 1004 from a digital signal processor may be input into a multiplier 1005. The multiplied signal may then be input into a digital-to-analog converter (DAC) 1006. The analog output signal from the DAC 1006 may be provided to a first variable amplifier 1008 controlled by software and dynamically adjusted by the processing circuit of the mobile device. The output of the first variable amplifier 1008 may then be input into a second variable amplifier 1010 which may be adjusted by a user. The output of the second variable amplifier 1010 may be sent to a speaker 1012.

A microphone 1014 in the microphone module 906 may receive sound from the speaker 1012 and convert the sound into an electrical signal. The electrical signal may then be sent to a third variable amplifier 1016 where an analog gain may be controlled by software and dynamically adjusted by the processing circuit of the mobile device. The electrical signal output from the third amplifier 1016 may be input into an analog-to-digital converter (ADC) 1018 where is it converted into a digital signal. The digital signal and a digital gain 1020 may then be provided to a multiplier 1021 and the multiplied signal may be sent to the digital signal processor 1022.

Figure 11:
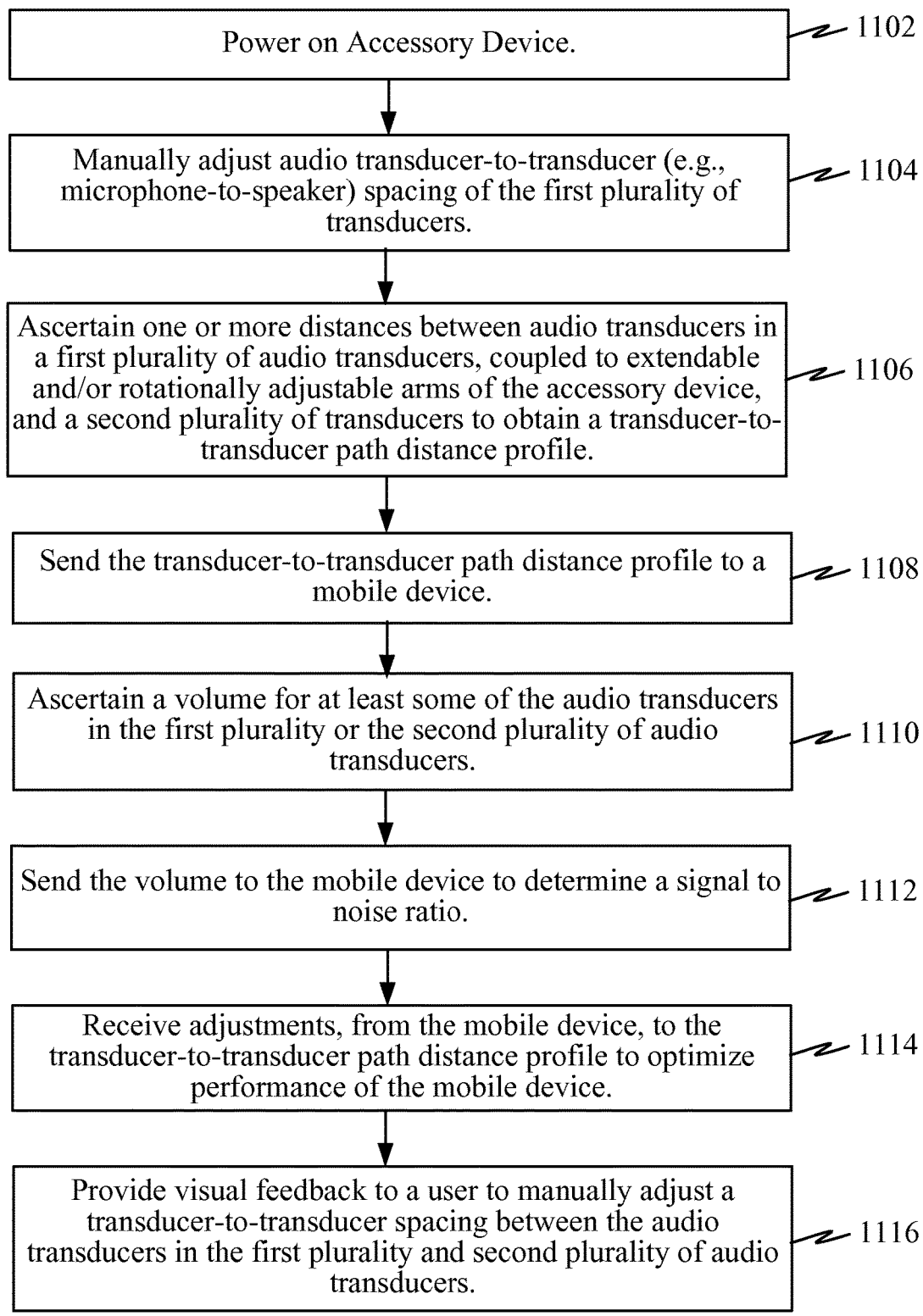
FIG. 11 illustrates a flow diagram of a method, operational on an accessory device, for measuring distances between speakers and microphones and communicating the distances to audio processing algorithms in a mobile device.

FIG. 11 illustrates a flow diagram of a method, operational on an accessory device, for measuring distances between audio transducers (e.g., speakers and microphones) and communicating the distances to audio processing algorithms in a mobile device. This may permit the mobile device to perform echo cancellation, for example, in conjunction with the accessory device. The accessory device may have a first plurality of audio transducers (e.g., microphones and/or speakers) located on one more adjustable bars/arms and/or a second plurality of audio transducers located elsewhere on the accessory device or external to the accessory device.

First, the accessory device may be powered on 1102. A user may then manually adjust the transducer-to-transducer spacing of the first plurality of transducers 1104. For instance, a user may slideably, rotatably, and/or flippably adjust one or more extendable and/or rotationally adjustable arms/bar(s), housing the first plurality of transducers (e.g., microphones and/or speakers) in the accessory device.

Once adjusted, the accessory device may ascertain the one or more distances between audio transducers in a first plurality of audio transducers, coupled to the extendible and/or rotationally adjustable arms of the accessory device, and the second plurality of audio transducers to obtain a transducer-to-transducer path distance profile 1106. In one example, the accessory device may automatically ascertain the one or more distances by sending an audible or higher than audible frequency signal and measuring the shortest time delay between when the signal was sent and when it was received between a first audio transducer from the first plurality of audio transducers and a second audio transducer from the second plurality of audio transducers. Ascertaining the one or more distances may involve (a) encoding the audible or higher than audible frequency signal into an encoded signal that reduces the impact of noise sources during transmission, and/or (b) monitoring for a code correlation between the encoded signal and received signals, by audio transducers from the first plurality of audio transducers and the second plurality of audio transducers, to ascertain a match. Furthermore, the one or more distances may be refined by using temperature and humidity information to select a speed of sound propagation from a lookup table. In another example, ascertaining the one or more distances may include sending higher than audible frequency sound, through at least one audio transducer from the first plurality of audio transducers and the second plurality of audio transducers, at a higher volume than the audible sound to raise the higher than audible frequency sound above an ambient noise floor.

In one example, a distance between two audio transducers, from the first plurality and second plurality of audio transducers, may be determined based on the position of predefined detents in one or more extendable and/or rotationally adjustable arms that are part of the accessory device and to which the first plurality of audio transducers are coupled.

In another example, least some of the one or more distances may be determined based on the position indicated by one or more sensors located in one or more extendable and/or rotationally adjustable arms that are part of the accessory device and to which the first plurality of audio transducers are coupled.

In some implementations, the accessory device may ascertain a distance between one or more microphone audio transducers, from at least one of the first plurality or second plurality of audio transducers, and one or more speaker audio transducers as a user interface to control other functions of the accessory device or a mobile device.

The transducer-to-transducer path distance profile may then be sent to a mobile device for processing with an acoustic echo canceller (algorithm) 1108.

The accessory device may ascertain a volume for at least some of the audio transducers in the first plurality of transducers or second plurality of transducers 1110. The volume may be sent to the mobile device to determine a signal to noise ratio 1112. For instance, such signal to noise ratio may serve to ascertain whether volume from speakers needs to be increased. That is, if the signal to noise ratio is below a threshold, then the mobile device may instruct the accessory device to increase the volume from one or more speaker audio transducers.

The accessory device may then receive adjustments, from the mobile device, to the transducer-to-transducer path distance profile to optimize performance of the mobile device 1114. In one example, the adjustments may then be provided to the user in the form of visual feedback providing the user to manually adjust a transducer-to-transducer spacing between the audio transducers in the first plurality and second plurality of audio transducers 1116. That is, the transducer-to-transducer path distance profile allows the user to dynamically compensate for the variable distances between the speaker transducers and the microphone transducers in the accessory device to optimize performance of the mobile device.

In one example, the maximum volume limit of one or more speaker audio transducers, from at least one of the first plurality or second plurality of audio transducers, may be adjusted based on a distance from the speaker audio transducers to one or more microphone audio transducers.

Exemplary Mobile Device and Operations Therein

Figure 12:
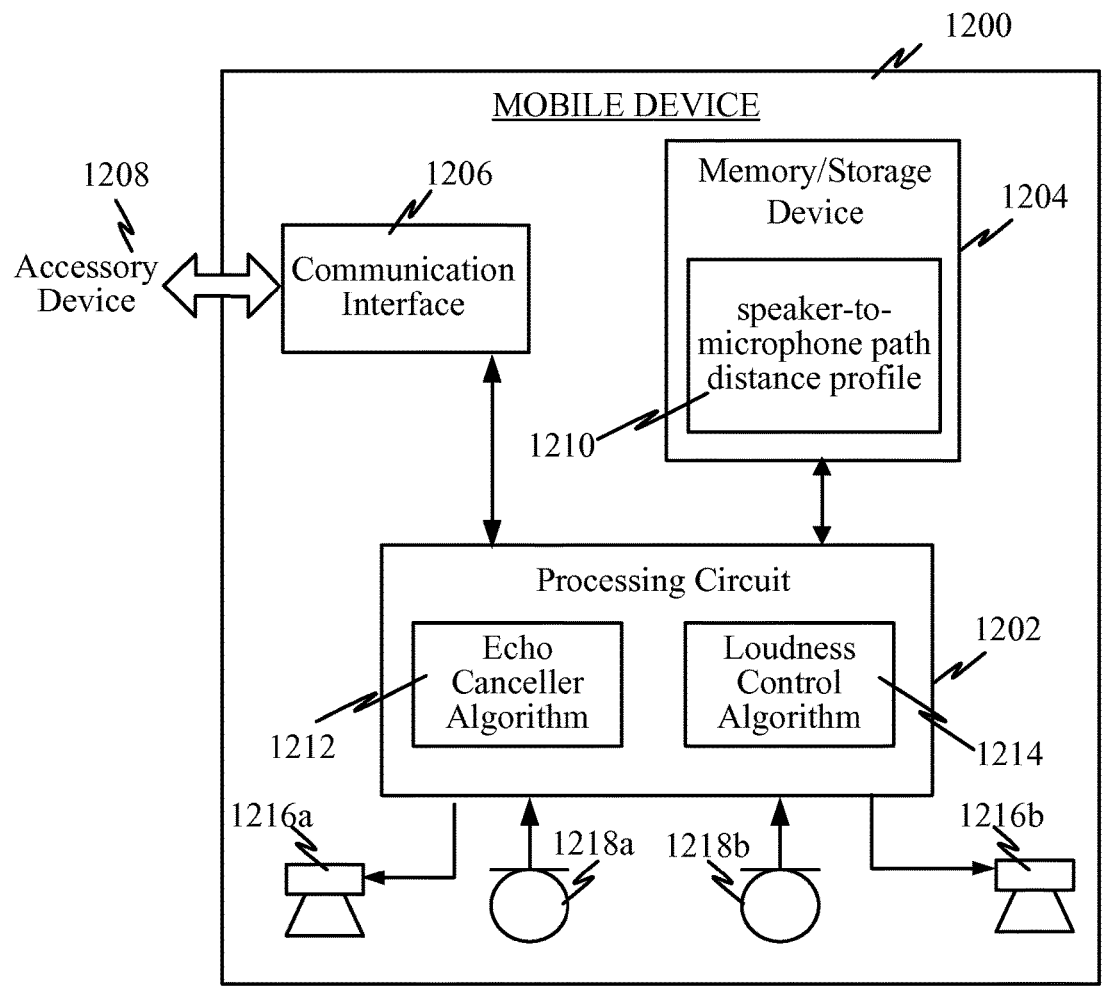
FIG. 12 illustrates a block diagram of an internal structure of a mobile device according to one example.

FIG. 12 illustrates a block diagram of an internal structure of a mobile device 1200 according to one example. The mobile device 1200 may include a processing circuit (e.g., processor, processing module, etc.) 1202 for executing computer-executable process steps and a memory device 1204. The mobile device 1200 may also include a communication interface 1206 for communicatively coupling the mobile device 1200 to a wireless communication network and/or an accessory device 1208. The memory/storage device 1204 may include operations (instructions) for storing speaker-to-microphone path distance profiles 1210. The processing circuit 1202 may implement these operations using acoustic echo canceller algorithms 1212 and loudness control algorithms 1214 which are known in the art.

Note that, in other examples, the mobile device may include a plurality of speakers 1216a and 1216b and/or microphones 1218a and 1218b along a plurality of different surfaces and/or sides of the mobile device.

Figure 13A:
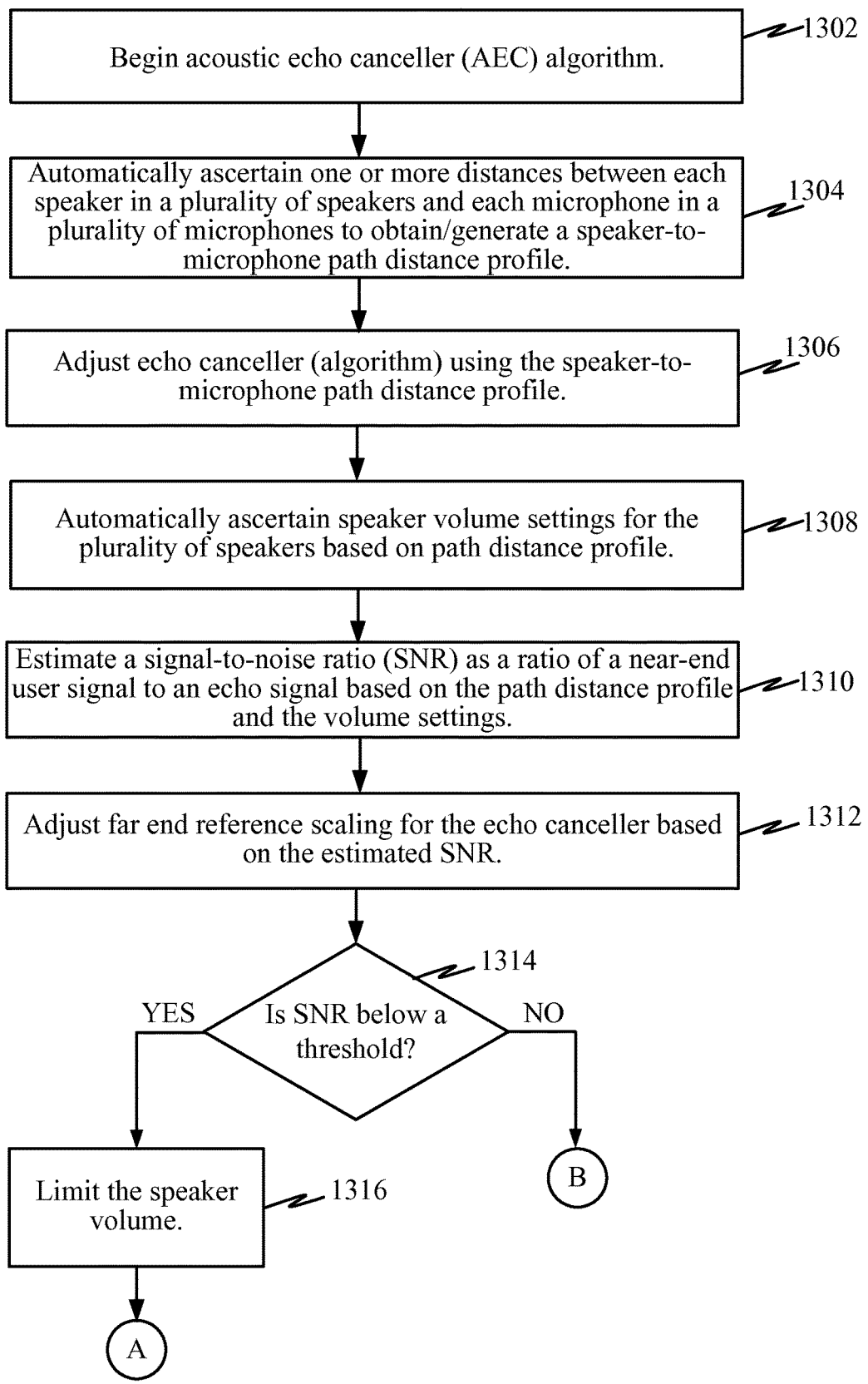
FIG. 13 (comprising FIGS. 13A and 13B) illustrates an acoustic echo cancellation algorithm that utilizes the speaker-to-microphone distance(s) data to optimize performance.
Figure 13B:
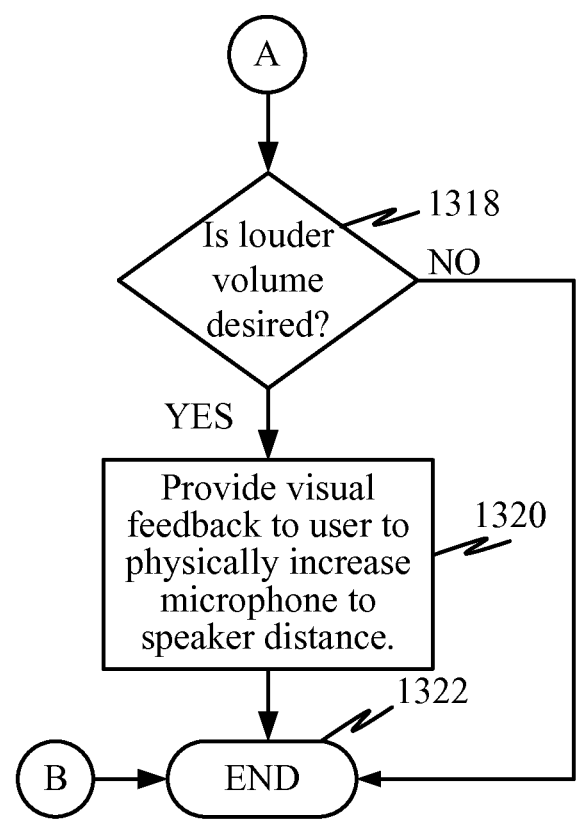

FIG. 13 (comprising FIGS. 13A and 13B) illustrates a flow diagram of a method, operational on a mobile device, for optimizing performance by removing the acoustic echoes resulting from the acoustic coupling between the speaker(s) and the microphone(s).

Here, an acoustic echo cancellation (AEC) algorithm (or echo canceller) may be implemented within a processing circuit of a mobile device 1302. The echo canceller may automatically receive or obtain one or more speaker-to-microphone distances (e.g., mechanically and/or acoustically ascertained as described above) between each speaker in a plurality of speakers and each microphone in a plurality of microphones to obtain a speaker-to-microphone path distance profile 1304. As described above, the one or more distances may be obtained using predefined detents and/or angular rotation sensors located on the extendable bars or the one or more distances may be obtained using acoustic methods. Using the speaker-to-microphone path distance profile, the echo canceller may be adjusted to remove the acoustic echoes 1306. Adjusting the echo canceller allows for optimizing performance by removing the acoustic echoes resulting from the acoustic coupling between the speaker(s) and the microphone(s).

Next, the mobile device may automatically ascertain the speaker volume settings for the plurality of speakers based on the previously obtained path distance profile 1308. That is, the path distance profile provides the location of each speaker allowing the speaker volume settings to be obtained. The volume settings of the speakers may be readily available if the processing circuit is coupled to or in communication with the speakers and serves to adjust the volume to the speakers to optimize the performance to reduce or eliminate the echoes.

The mobile device, via the echo canceller, may then estimate a signal-to-noise ratio (SNR) as a ratio of a near-end user signal to an echo signal based on the path distance profile and the volume settings 1310 obtained previously. Based on the estimated SNR, the far end reference scaling for the echo canceller may be adjusted 1312.

Next, a determination is made as to whether the SNR is below a pre-determined threshold for optimal performance 1314. If the SNR is not below the threshold, the echo canceller (i.e. the algorithm) is exited 1322. However, if it is determined that the SNR is below the pre-determined threshold, the speaker volume (i.e. the volume setting on each speaker) may be reduced or limited 1316.

Next, a determination is made as to whether a louder volume for the plurality of speakers is desired by the user 1318. If louder volume for the plurality of speakers is not desired, the echo canceller (i.e. the algorithm) may be exited 1322. However, if it is determined that louder volume is desired for the plurality of speakers, visual feedback may be provided to the user instructing the user to physically adjust, for example increase, the microphone-to-speaker distance 1320. As discussed above, adjusting the microphone-to-speaker distance may optimize the acoustic performance. The visual feedback may be provided to the user on the display of a mobile device or a display on an accessory if the accessory device has one. Once visual feedback has been provided to the user and the user has adjusted the distance, the echo canceller (i.e. the algorithm) may be exited 1322.

In one implementation, a speaker-to-microphone path distance profile may be dynamically and/or automatically obtained by a processing circuit of the mobile device. For instance, the processing circuit may be adapted to send a calibration audio signal from each speaker (e.g., independently, sequentially, and/or one speaker at a time) and sensed by each microphone to estimate a distance between each microphone and speaker. Additionally, the processing circuit may use captured audio (from a user) to generate the speaker-to-microphone path distance profile.

Figure 14A:
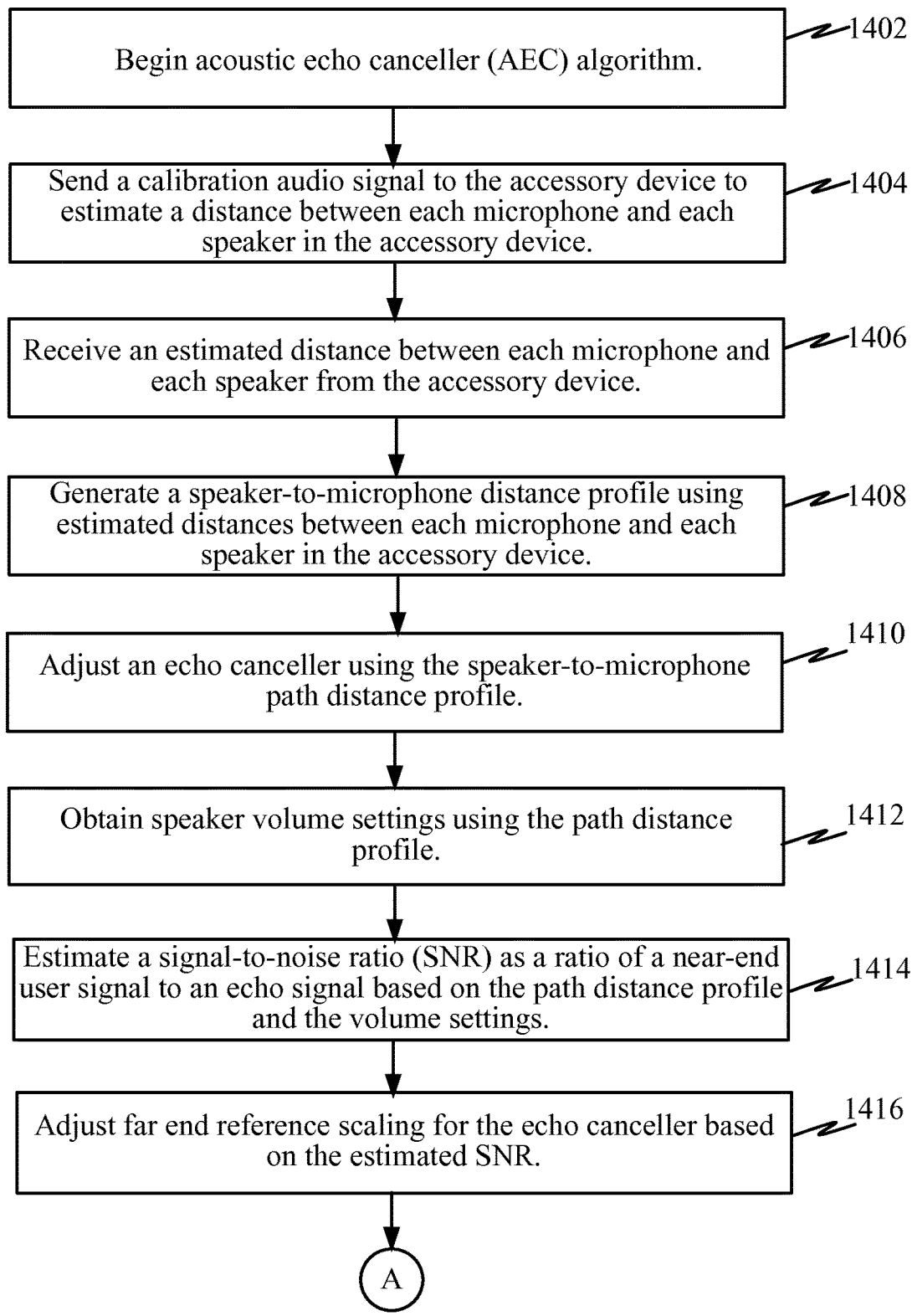
FIG. 14 (comprising FIGS. 14A and 14B) illustrates a flow diagram of a method, operational on a mobile device, for creating an audio profile using an external accessory device.
Figure 14B:
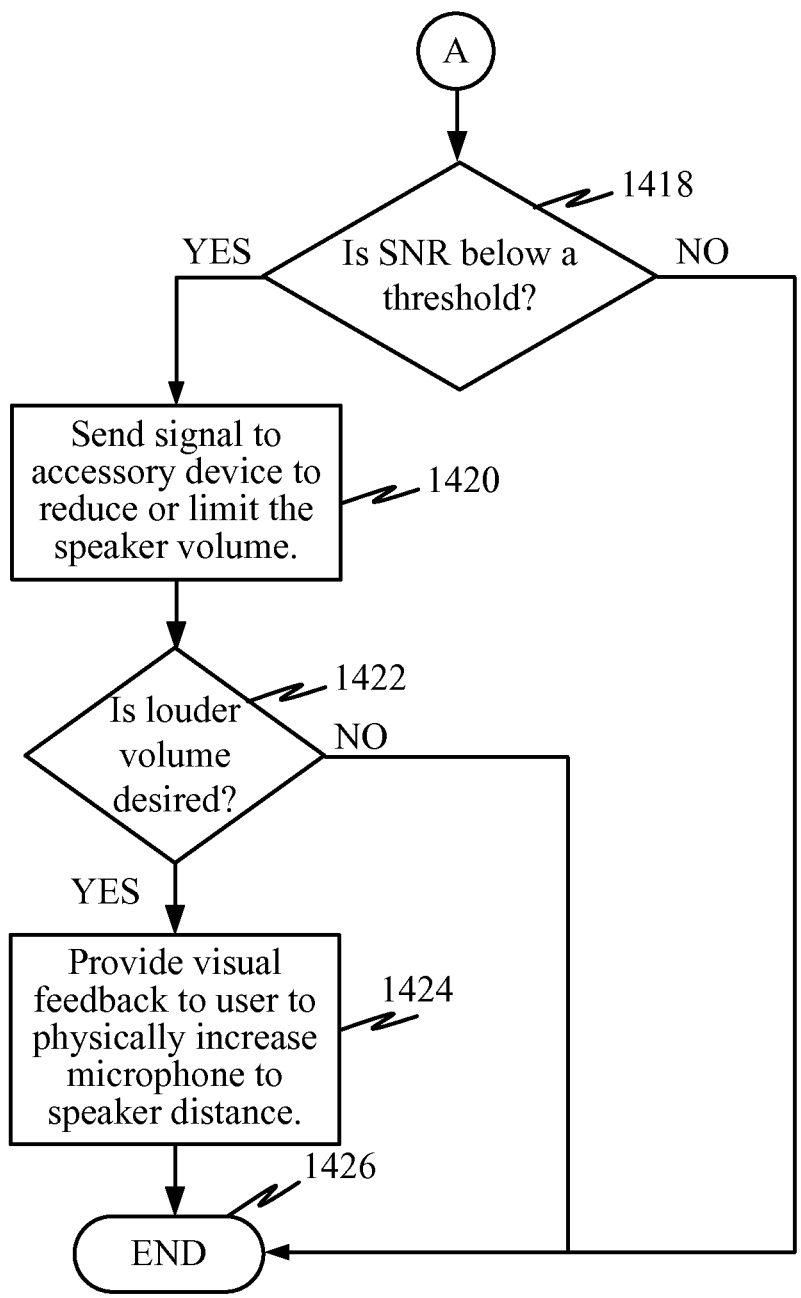

FIG. 14 (comprising FIGS. 14A and 14B) illustrates a flow diagram of a method, operational on a mobile device, for creating an audio profile using an external accessory device. As described above, the external accessory device may include a plurality of speakers and/or a plurality of microphones for broadcasting or capturing acoustic signals on behalf of the mobile device Here, an acoustic echo cancellation (AEC) algorithm (or echo canceller) may be implemented within a processing circuit of the mobile device 1402. First, the mobile device may send a calibration audio signal to the accessory to estimate a distance between each microphone and each speaker in the accessory device 1404. Next, the mobile device may receive, from the accessory device, an estimated distance between each microphone and each speaker 1406. Using the estimated distances between each microphone and each speaker in the accessory device, a speaker-to-microphone distance profile may be generated 1408. The speaker-to-microphone path distance profile may then be used to adjust an echo canceller to remove the acoustic echoes 1410. Adjusting the echo canceller allows for optimizing performance by removing the acoustic echoes resulting from the acoustic coupling between the speaker(s) and the microphone(s).

Next, the mobile device may obtain the speaker volume settings for the plurality of speakers based on the previously obtained path distance profile 1412. That is, the path distance profile provides the location of each speaker allowing the speaker volume settings to be obtained.

A signal-to-noise ratio (SNR) may then be estimated as a ratio of a near-end user signal to an echo signal based on the path distance profile and the volume settings 1414. Based on the estimated SNR, the far end reference scaling for the echo canceller may be adjusted 1416.

Next, a determination may be made as to whether the SNR is below a pre-determined threshold for optimal performance 1418. If the SNR is not below the threshold, the echo canceller (i.e. the algorithm) may be exited 1426. However, if it is determined that the SNR is below the pre-determined threshold, the mobile device may send a signal to the accessory device to reduce or limit the speaker volume 1420. The signal may be sent to the plurality of speakers. Reducing or limiting the speaker volume may provide for better double talk performance and avoid non-linear coupling between the microphone and the speakers.

Next, a determination is made as to whether a louder volume for the speakers is desired by the user 1422. If louder volume for one or more of the speakers is not desired, the echo canceller (i.e. the algorithm) may be exited 1426. However, if it is determined that louder volume is desired for the speakers, visual feedback may be provided to the user instructing the user to physically adjust, for example increase, the microphone-to-speaker distance on the accessory device 1424. As discussed above, adjusting the microphone-to-speaker distance may optimize the acoustic performance. The visual feedback may be provided to the user on the display of the mobile device. Once visual feedback has been provided to the user and the user has adjusted the distance, the echo canceller (i.e. the algorithm) may be exited 1426.

One or more of the components, steps, features and/or functions illustrated in the FIGS. may be rearranged and/or combined into a single component, step, feature or function or embodied in several components, steps, or functions. Additional elements, components, steps, and/or functions may also be added without departing from novel features disclosed herein. The apparatus, devices, and/or components illustrated in the FIGS. may be configured to perform one or more of the methods, features, or steps described in the FIGS. The novel algorithms described herein may also be efficiently implemented in software and/or embedded in hardware.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a function, a procedure, a subroutine, a subprogram, etc. When a process corresponds to a function, its termination corresponds to a return of the function to the calling function or the main function.

Moreover, a storage medium may represent one or more devices for storing data, including read-only memory (ROM), random access memory (RAM), magnetic disk storage mediums, optical storage mediums, flash memory devices and/or other machine-readable mediums, processor-readable mediums, and/or computer-readable mediums for storing information. The terms "machine-readable medium", "computer-readable medium", and/or "processor-readable medium" may include, but are not limited to non-transitory mediums such as portable or fixed storage devices, optical storage devices, and various other mediums capable of storing, containing or carrying instruction(s) and/or data. Thus, the various methods described herein may be fully or partially implemented by instructions and/or data that may be stored in a "machine-readable medium", "computer-readable medium", and/or "processor-readable medium" and executed by one or more processors, machines and/or devices.

Furthermore, embodiments may be implemented by hardware, software, firmware, middleware, microcode, or any combination thereof. When implemented in software, firmware, middleware or microcode, the program code or code segments to perform the necessary tasks may be stored in a machine-readable medium such as a storage medium or other storage(s). A processor may perform the necessary tasks. A code segment may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

The various illustrative logical blocks, modules, circuits, elements, and/or components described in connection with the examples disclosed herein may be implemented or performed with a general purpose processor, a digital signal processor (DSP), an application specific integrated circuit (ASIC), a field programmable gate array (FPGA) or other programmable logic component, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing components, e.g., a combination of a DSP and a microprocessor, a number of microprocessors, one or more microprocessors in conjunction with a DSP core, or any other such configuration.

The methods or algorithms described in connection with the examples disclosed herein may be embodied directly in hardware, in a software module executable by a processor, or in a combination of both, in the form of processing unit, programming instructions, or other directions, and may be contained in a single device or distributed across multiple devices. A software module may reside in RAM memory, flash memory, ROM memory, EPROM memory, EEPROM memory, registers, hard disk, a removable disk, a CD-ROM, or any other form of storage medium known in the art. A storage medium may be coupled to the processor such that the processor can read information from, and write information to, the storage medium. In the alternative, the storage medium may be integral to the processor.

Those of skill in the art would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system.

The various features of the invention described herein can be implemented in different systems without departing from the invention. It should be noted that the foregoing embodiments are merely examples and are not to be construed as limiting the invention. The description of the embodiments is intended to be illustrative, and not to limit the scope of the claims. As such, the present teachings can be readily applied to other types of apparatuses and many alternatives, modifications, and variations will be apparent to those skilled in the art.

What is claimed is:

1. An accessory device comprising:
   a housing;
   one or more extendable and/or rotationally adjustable arms secured to the housing, at least one of the one or more adjustable arms coupled to an audio transducer from a first plurality of audio transducers;
   an audio module, in communication with the first plurality of audio transducers, for ascertaining distances from at least two of the first plurality of audio transducers to at least two of a second plurality of audio transducers to obtain a transducer-to-transducer path distance profile, wherein the transducer-to-transducer path distance profile is based on at least a distance between a first microphone and a first speaker, a distance between the first microphone and a second speaker, a distance between a second microphone and the first speaker, and a distance between the second microphone and the second speaker;
   a speaker driving circuit to send higher than audible frequency sound, through at least one audio transducer from the first plurality of audio transducers and the second plurality of audio transducers, at a higher volume than audible sound to raise the higher than audible frequency sound above an ambient noise floor; and
   a communication interface, coupled to the audio module, for sending the transducer-to-transducer path distance profile to a mobile device.

2. The accessory device of claim 1, wherein the first plurality of audio transducers includes at least one of: microphones, speakers, or microphones and speakers.

3. The accessory device of claim 1, wherein the audio module ascertains the distances automatically by:
   sending an audible sound or the higher than audible frequency sound, and
   measuring a shortest time delay between when the audible sound or the higher than audible frequency sound was sent and when it was received between a first audio transducer from the first plurality of audio transducers and a second audio transducer from the second plurality of audio transducers.

4. The accessory device of claim 3, wherein the audio module is further adapted to:
   encode the audible sound or the higher than audible frequency sound into an encoded signal that reduces an impact of noise sources during transmission, and
   monitor for a code correlation between the encoded signal and received signals, by audio transducers from the first plurality of audio transducers and the second plurality of audio transducers, to ascertain a match.

5. The accessory device of claim 1, wherein the audio module further refines at least one of the distances by using temperature and humidity information to select a speed of sound propagation from a lookup table.

6. The accessory device of claim 1, wherein the second plurality of audio transducers includes at least one of: internal speakers, external speakers, or internal and external speakers.

7. The accessory device of claim 1, wherein at least one audio transducer from the first plurality of audio transducers is adjustable relative to the second plurality of audio transducers by extension and/or rotation of the adjustable arms.

8. The accessory device of claim 1, wherein predefined detents in the one or more extendable and/or rotationally adjustable arms are used to determine at least one of the distances.

9. The accessory device of claim 8, wherein one or more sensors located on the one or more extendable and/or rotationally adjustable arms are used to detect a position of the one or more extendable and/or rotationally adjustable arms.

10. The accessory device of claim 1, further comprising:
    a visual indicator located within the housing for indicating to a user to adjust a transducer-to-transducer spacing between the audio transducers in the first plurality and second plurality of audio transducers.

11. The accessory device of claim 1, wherein a digital gain and an analog gain of sound propagation paths for at least some of the audio transducers from the first plurality of audio transducers and second plurality of audio transducers are dynamically adjusted by the mobile device.

12. The accessory device of claim 11, wherein the digital gain and analog gain of sound propagation paths for at least some of the audio transducers from the first plurality of audio transducers and second plurality of audio transducers are adjusted to ensure audio output from speaker audio transducers does not saturate input into microphone audio transducers.

13. The accessory device of claim 1, wherein the transducer-to-transducer path distance profile is transmitted to the mobile device wirelessly.

14. The accessory device of claim 1, wherein at least one or more other audio transducers from the second plurality of transducers are detachable from the accessory device.

15. The accessory device of claim 1, wherein each of the one or more extendable and/or rotationally adjustable arms is independently adjustable.

16. The accessory device of claim 1, wherein the audio module further ascertains a volume for audio transducers in at least one of the first plurality of audio transducers or the second plurality of audio transducers and sends the volume to the mobile device to determine a signal to noise ratio.

17. The accessory device of claim 1, wherein the audio module further adjusts a maximum volume limit of one or more speaker audio transducers, from at least one of the first plurality or second plurality of audio transducers, based on at least one of the distances.

18. The accessory device of claim 1, wherein the audio module further controls other functions of the accessory device or mobile device based on at least one of the distances.

19. The accessory device of claim 1, further comprising a slot extending horizontally along a top surface of the housing and wherein a first end of a first section of a plurality of sections of the one or more extendable and/or rotationally adjustable arms is slideably engaged with the slot allowing the one or more extendable and/or rotationally adjustable arms to move horizontally across the housing.

20. A method operational on an accessory device for optimizing audio processing functions, comprising:
ascertaining distances from at least two of a first plurality of audio transducers, coupled to extendable and/or rotationally adjustable arms of the accessory device, to at least two of a second plurality of audio transducers to obtain a transducer-to-transducer path distance profile, wherein the transducer-to-transducer path distance profile is based on at least a distance between a first microphone and a first speaker, a distance between the first microphone and a second speaker, a distance between a second microphone and the first speaker, and a distance between the second microphone and the second speaker, wherein ascertaining the distances comprises:
sending higher than audible frequency sound, through at least one audio transducer from the first plurality of audio transducers and the second plurality of audio transducers, at a higher volume than audible sound to raise the higher than audible frequency sound above an ambient noise floor; and
sending the transducer-to-transducer path distance profile to a mobile device.

21. The method of claim 20, wherein ascertaining the distances further comprises:
automatically ascertaining the distances by sending an audible sound or the higher than audible frequency sound and measuring a shortest time delay between when the audible sound or the higher than audible frequency sound was sent and when it was received between a first audio transducer from the first plurality of audio transducers and a second audio transducer from the second plurality of audio transducers.

22. The method of claim 21, wherein ascertaining the distances further comprises:
encoding the audible sound or the higher than audible frequency sound into an encoded signal that reduces an impact of noise sources during transmission, and
monitoring for a code correlation between the encoded signal and received signals, by audio transducers from the first plurality of audio transducers and the second plurality of audio transducers, to ascertain a match.

23. The method of claim 20, wherein ascertaining the distances further comprises:
refining one or more of the distances by using temperature and humidity information to select a speed of sound propagation from a lookup table.

24. The method of claim 20, wherein ascertaining the distances further comprises:
determining at least one of the distances based on a position of predefined detents in one or more extendable and/or rotationally adjustable arms that are part of the accessory device and to which the first plurality of audio transducers are coupled.

25. The method of claim 20, wherein ascertaining the distances further comprises:
determining at least some of the distances based on a position indicated by one or more sensors located in one or more extendable and/or rotationally adjustable arms that are part of the accessory device and to which the first plurality of audio transducers are coupled.

26. The method of claim 20, further comprising:
ascertaining a volume for at least some of the audio transducers in the first plurality or second plurality of audio transducers; and
sending the volume to the mobile device to determine a signal to noise ratio.

27. The method of claim 20, further comprising:
adjusting a maximum volume limit of one or more speaker audio transducers, from at least one of the first plurality or second plurality of audio transducers, based on at least one of the distances.

28. The method of claim 20, further comprising:
controlling other functions of the accessory device or mobile device based on at least one of the distances.

29. The method of claim 20, further comprising:
receiving adjustments, from the mobile device, to the transducer-to-transducer path distance profile to optimize performance of the mobile device.

30. The method of claim 20, further comprising:
providing visual feedback to a user to manually adjust a transducer-to-transducer spacing between the audio transducers in the first plurality and second plurality of audio transducers.

31. An accessory device, comprising:
means for ascertaining distances from at least two of a first plurality of audio transducers, coupled to extendable and/or rotationally adjustable arms of the accessory device, to at least two of a second plurality of audio transducers to obtain a transducer-to-transducer path distance profile, wherein the transducer-to-transducer path distance profile is based on at least a distance between a first microphone and a first speaker, a distance between the first microphone and a second speaker, a distance between a second microphone and the first speaker, and a distance between the second microphone and the second speaker;
means for sending higher than audible frequency sound, through at least one audio transducer from the first plurality of audio transducers and the second plurality of audio transducers, at a higher volume than audible sound to raise the higher than audible frequency sound above an ambient noise floor; and
means for sending the transducer-to-transducer path distance profile to a mobile device.

32. The accessory device of claim 31, further comprising:
means for automatically ascertaining at least one of the distances by sending an audible sound or the higher than audible frequency sound and measuring a shortest time delay between when the audible sound or the higher than audible frequency sound was sent and when it was received between a first audio transducer from the first plurality of audio transducers and a second audio transducer from the second plurality of audio transducers.

33. The accessory device of claim 31, further comprising:
means for encoding the audible sound or the higher than audible frequency sound signal into an encoded signal that reduces an impact of noise sources during transmission, and
means for monitoring for a code correlation between the encoded signal and received signals, by audio transducers from the first plurality of audio transducers and the second plurality of audio transducers, to ascertain a match.

34. The accessory device of claim 31, wherein the means for ascertaining the distances further comprises:
means for refining one or more of the distances by using temperature and humidity information to select a speed of sound propagation from a lookup table.

35. The accessory device of claim 31, further comprising:
means for determining at least one of the distances based on a position of predefined detents in one or more extendable and/or rotationally adjustable arms that are part of the accessory device and to which the first plurality of audio transducers are coupled.

36. The accessory device of claim 31, further comprising:
means for determining at least some of the distances based on a position indicated by one or more sensors located in one or more extendable and/or rotationally adjustable arms that are part of the accessory device and to which the first plurality of audio transducers are coupled.

37. The accessory device of claim 31, further comprising:
means for refining at least one of the distances by using temperature and humidity information to select a speed of sound propagation from a lookup table.

38. The accessory device of claim 31, further comprising:
means for ascertaining a volume for at least some of the audio transducers in the first plurality or second plurality of audio transducers; and
means for sending the volume to the mobile device to determine a signal to noise ratio.

39. The accessory device of claim 31, further comprising:
means for adjusting a maximum volume limit of one or more speaker audio transducers, from at least one of the first plurality or second plurality of audio transducers, based on at least one of the distances.

40. The accessory device of claim 31, further comprising:
means for controlling other functions of the accessory device or mobile device based on at least one of the distances.

41. The accessory device of claim 31, further comprising:
means for receiving adjustments, from the mobile device, to the transducer-to-transducer path distance profile to optimize performance of the mobile device.

42. A non-transitory machine-readable medium having instructions stored thereon, which when executed by at least one processor of an accessory device causes the at least one processor to:
ascertain distances at least two of a first plurality of audio transducers, coupled to extendable and/or rotationally adjustable arms of the accessory device, at least two of a second plurality of audio transducers to obtain a transducer-to-transducer path distance profile, wherein the transducer-to-transducer path distance profile is based on at least a distance between a first microphone and a first speaker, a distance between the first microphone and a second speaker, a distance between a second microphone and the first speaker, and a distance between the second microphone and the second speaker;
send higher than audible frequency sound, through at least one audio transducer from the first plurality of audio transducers and the second plurality of audio transducers, at a higher volume than audible sound to raise the higher than audible frequency sound above an ambient noise floor; and
send the transducer-to-transducer path distance profile to a mobile device.

43. The non-transitory machine-readable medium of claim 42, including further instructions which when executed by the at least one processor causes the at least one processor to:
automatically ascertain at least one of the distances by sending an audible sound or the higher than audible frequency sound and measuring a shortest time delay between when the audible sound or the higher than audible frequency sound was sent and when it was received between a first audio transducer from the first plurality of audio transducers and a second audio transducer from the second plurality of audio transducers.

44. The non-transitory machine-readable medium of claim 42, including further instructions which when executed by the at least one processor causes the at least one processor to:
ascertain a volume for at least some of the audio transducers in the first plurality or second plurality of audio transducers; and
send the volume to the mobile device to determine a signal to noise ratio.

* * * * *